US012562755B2

(12) United States Patent
Oboukhov et al.

(10) Patent No.: US 12,562,755 B2
(45) Date of Patent: Feb. 24, 2026

(54) MULTI-TIER ERROR CORRECTION CODES FOR DNA DATA STORAGE

(71) Applicant: Western Digital Technologies, Inc., San Jose, CA (US)

(72) Inventors: Iouri Oboukhov, Rochester, MN (US); Richard Leo Galbraith, Rochester, MN (US); Niranjay Ravindran, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 86 days.

(21) Appl. No.: 18/464,494

(22) Filed: Sep. 11, 2023

(65) Prior Publication Data

US 2025/0088203 A1     Mar. 13, 2025

(51) Int. Cl.
*H03M 13/19* (2006.01)
*H03M 13/00* (2006.01)

(52) U.S. Cl.
CPC ......... *H03M 13/19* (2013.01); *H03M 13/611* (2013.01)

(58) Field of Classification Search
None
See application file for complete search history.

(56) References Cited

U.S. PATENT DOCUMENTS

| | | | |
|---|---|---|---|
| 8,407,554 B2 | 3/2013 | Kermani | |
| 8,937,564 B2 | 1/2015 | Aloni | |
| 9,234,239 B2 | 1/2016 | Sikora | |
| 9,830,553 B2 | 11/2017 | Chen | |
| 10,027,347 B2 | 7/2018 | Le Scouarnec | |
| 10,370,246 B1 | 8/2019 | Milenkovic | |
| 10,423,341 B1 | 9/2019 | Kermani | |
| 10,566,077 B1 | 2/2020 | Milenkovic | |
| 10,650,312 B2 | 5/2020 | Roquet | |
| 10,742,233 B2 | 8/2020 | Erlich | |
| 10,810,495 B2 | 10/2020 | Roth | |
| 10,818,378 B2 | 10/2020 | Hutchison, III | |

(Continued)

FOREIGN PATENT DOCUMENTS

| | | |
|---|---|---|
| CN | 118138060 A | 6/2024 |
| EP | 3416076 A1 | 12/2018 |

(Continued)

OTHER PUBLICATIONS

M. Zhang, K. Cai, K. A. Schouhamer Immink and P. Chen, "Soft-Decision Decoding for DNA-Based Data Storage," 2018 International Symposium on Information Theory and Its Applications (ISITA), Singapore, 2018, pp. 16-20, (Year: 2018).*

(Continued)

*Primary Examiner* — Daniel F. McMahon
(74) *Attorney, Agent, or Firm* — Patent Law Works LLP

(57) ABSTRACT

Example systems and methods for using a multi-tier error correction code distributed among oligos for DNA data storage are described. A data unit is encoded as a set of codewords where each codeword is distributed as symbols on different oligos. The codewords include a set of first tier codewords that include CRC and ECC redundancy data and one or more additional tiers of codewords that include permuted data and corresponding ECC redundancy data. Decoding includes a sequence of decoding iterations between the first tier of codewords and additional tiers of codewords.

20 Claims, 8 Drawing Sheets

(56) References Cited

U.S. PATENT DOCUMENTS

| | | | | |
|---|---|---|---|---|
| 10,917,109 B1 * | 2/2021 | Dimopoulou | ....... | H03M 7/3088 |
| 10,956,806 B2 | 3/2021 | Masuda | | |
| 11,017,170 B2 | 5/2021 | Yin | | |
| 11,093,547 B2 | 8/2021 | Su | | |
| 11,098,303 B2 | 8/2021 | Zhuang | | |
| 11,227,219 B2 | 1/2022 | Roquet | | |
| 11,249,941 B2 | 2/2022 | Unidad | | |
| 11,435,905 B1 | 9/2022 | Kermani | | |
| 11,755,649 B2 | 9/2023 | Wei | | |
| 11,755,922 B2 | 9/2023 | Milenkovic | | |
| 11,763,169 B2 | 9/2023 | Roquet | | |
| 2004/0191788 A1 | 9/2004 | Gleba | | |
| 2007/0042372 A1 | 2/2007 | Arita | | |
| 2010/0199155 A1 | 8/2010 | Kermani | | |
| 2011/0172975 A1 | 7/2011 | Silva Filho | | |
| 2011/0269119 A1 | 11/2011 | Hutchison | | |
| 2017/0109229 A1 * | 4/2017 | Huetter | ............... | G06F 11/1004 |
| 2017/0134045 A1 | 5/2017 | Huetter | | |
| 2018/0046921 A1 * | 2/2018 | Chen | .................... | G11C 7/1006 |
| 2019/0130280 A1 * | 5/2019 | Erden | .................... | G16B 50/30 |
| 2019/0362814 A1 | 11/2019 | Roquet | | |
| 2019/0363739 A1 * | 11/2019 | Erlich | ............... | H03M 13/3761 |
| 2020/0043568 A1 | 2/2020 | Sikora | | |
| 2020/0185057 A1 * | 6/2020 | Leake | .................... | B82Y 10/00 |
| 2020/0193301 A1 * | 6/2020 | Roquet | .................. | G16B 25/20 |
| 2020/0211677 A1 | 7/2020 | Fan | | |
| 2021/0024924 A1 | 1/2021 | Qi | | |
| 2021/0050073 A1 | 2/2021 | Chen | | |
| 2021/0074380 A1 | 3/2021 | Yekhanin | | |
| 2021/0079382 A1 * | 3/2021 | Leake | ............... | C12N 15/1065 |
| 2021/0098081 A1 | 4/2021 | Yekhanin | | |
| 2021/0108194 A1 | 4/2021 | Nathaniel | | |
| 2021/0166159 A1 * | 6/2021 | Rubenstein | .............. | G06N 3/08 |
| 2021/0202032 A1 * | 7/2021 | Krsticevic | .............. | G16B 30/10 |
| 2021/0210171 A1 | 7/2021 | Stirparo | | |
| 2021/0225461 A1 | 7/2021 | Merriman | | |
| 2022/0002781 A1 | 1/2022 | Harness | | |
| 2022/0044763 A1 | 2/2022 | Karimi | | |
| 2022/0364991 A1 | 11/2022 | Wanunu | | |
| 2023/0027270 A1 * | 1/2023 | Rubenstein | .......... | G06N 99/007 |
| 2023/0257801 A1 * | 8/2023 | Brodin | .................. | C12Q 1/6827 |
| | | | | 435/6.11 |
| 2023/0317164 A1 * | 10/2023 | Roquet | .................. | G11C 13/02 |
| | | | | 365/151 |
| 2024/0257147 A1 * | 8/2024 | Owen | ............... | G06Q 30/0185 |
| 2025/0020657 A1 * | 1/2025 | Graige | .................... | C12N 15/00 |
| 2025/0037039 A1 * | 1/2025 | Rosenstein | .......... | G06N 3/0499 |

FOREIGN PATENT DOCUMENTS

| | | | |
|---|---|---|---|
| WO | 2018148260 A1 | 8/2018 | |
| WO | 2019046768 A1 | 3/2019 | |
| WO | 2021072398 A1 | 4/2021 | |
| WO | 2021105974 A1 | 6/2021 | |
| WO | 2021231493 A1 | 11/2021 | |

OTHER PUBLICATIONS

M. Dimopoulou, M. Antonini, P. Barbry and R. Appuswamy, "Storing Digital Data Into DNA: A Comparative Study Of Quaternary Code Construction," ICASSP 2020-2020 IEEE International Conference on Acoustics, Speech and Signal Processing (ICASSP), Barcelona, Spain, 2020, pp. 4332-4336, (Year: 2020).*

Christner et al., "DNA Data Storage—DNA Data Storage Alliance—Rosetta Stone Initiative", Storage Networking Industry Association, Storage Developer Conference, Fremont, CA, Sep. 12-15, 2022.

Gervasio et al., "DNA Data Storage—A Decade of Coding and Decoding, How Far Have We Got?", Storage Networking Industry Association, Storage Developer Conference, Fremont, CA, Sep. 12-15, 2022.

Landsman et al., "DNA Data Storage Alliance: Building a DNA Data Storage Ecosystem", Storage Networking Industry Association, Storage Developer Conference, Fremont, CA, Sep. 12-15, 2022.

Marelli et al., "DNAssim: A Full System Simulator for DNA Storage", Storage Networking Industry Association, Storage Developer Conference, Fremont, CA, Sep. 12-15, 2022.

Ogus et al., "The Looming Need for Molecular Storage", Storage Networking Industry Association, Storage Developer Conference, Fremont, CA, Sep. 12-15, 2022.

Piantanida et al., "Nucleic Acid Memory—Super Resolution Microscopy Enhances Novel Approach to DNA Data Storage", Boise State University, Storage Developer Conference, Fremont, CA, Sep. 12-15, 2022.

Reis et al., "Coding and Decoding, an Experience from a Brazilian Research Center", Storage Networking Industry Association, Storage Developer Conference, Fremont, CA, Sep. 12-15, 2022.

Dimopoulou et al., "Image storage onto synthetic DNA", Signal Processing: Image Communication, vol. 97, 116331, May 27, 2021 Y sections 5.1-5.2; and figure B.3.

Nakata et al., "Synchronization and Asymmetric Error Correction for Nanopore Sequencing," 2021 IEEE International Conference on Consumer Electronics—Taiwan, pp. 1-2, (2021).

Lu et al., "Design of Nonbinary Error Correction Codes With a Maximum Run-length Constraint to Correct a Single Insertion or Deletion Error for Dna Storage", Institute of Electrical and Electronics Engineers (IEEE), vol. 9, pp. 135354-135363, (2021).

Cai et al., "Correcting a Single Indel/Edit for DNA-Based Data Storage: Linear-Time Encoders and Order-Optimality", EEE Transactions on Information Theory, vol. 67, No. 6, pp. 3438-3451, (2021).

Chen et al., "Multiple Interleaved RS Codes for Data Storage Using Up to Mb-scale Synthetic DNA in Living Cells", Synthetic Biology Journal, vol. 2, Issue 3, pp. 428-443, (2021).

Goto et al., "Coding of Insertion-deletion-substitution Channels Without Markers", 2016 IEEE International Symposium on Information Theory, pp. 635-639, (2016).

Khuat et al., "A Quaternary Code Correcting a Burst of at Most Two Deletion or Insertion Errors in DNA Storage", Entropy, vol. 23, No. 12, pp. 1592, (2021).

Kiah et al., "Codes for DNA Sequence Profiles", IEEE Transactions on Information Theory, vol. 62, No. 6, pp. 3125-3146, (2016).

Limbachiya et al., "On Optimal Family of Codes for Archival DNA Storage", Seventh International Workshop on Signal Design and its Applications in Communications, pp. 123-127, (2015).

Yin et al., "Design of Constraint Coding Sets for Archive DNA Storage", IEEE/ACM Transactions on Computational Biology and Bioinformatics, vol. 19, No. 6, pp. 3384-3394, (2022).

Chauhan et al., "Portable and Error-Free DNA-Based Data Storage", 2021 4th International Conference on Recent Developments in Control, pp. 418-421, (2021).

Deng et al., "Optimized Code Design for Constrained DNA Data Storage With Asymmetric Errors", IEEE Access, vol. 7, pp. 84107-84121, (2019).

Jain et al., "Duplication-Correcting Codes for Data Storage in the DNA of Living Organisms", IEEE Transactions on Information Theory, vol. 63, No. 8, pp. 4996-5010 (2017).

Press et al., "HEDGES Error-correcting Code for DNA Storage Corrects Indels and Allow Sequence Constraints", Proc Natl Acad Sci USA, vol. 117, No. 31, pp. 18489-18496, (2020).

Wei et al., "Improved Coding Over Sets for DNA-Based Data Storage", IEEE Transactions on Information Theory, vol. 68, No. 1, pp. 118-129, (2022).

Wu et al., "HD-Code: End-to-End High Density Code for DNA Storage", IEEE Transactions on NanoBioscience, vol. 20, No. 4, pp. 455-463, (2021).

Yan et al., "New Levenshtein-Marker Code for DNA-based Data Storage Capable of Correcting Multiple Edit Errors", TechRxiv. (2021).

Hamoum et al., "Channel Model with Memory for DNA Data Storage with Nanopore Sequencing", 2021 11th International Symposium on Topics in Coding , pp. 1-5, (2021).

Hamoum et al, "DNA Data Storage Algorithms and Synchronization." Information Theory [math.IT]. Universit? Bretagne Sud,

(56)          References Cited

OTHER PUBLICATIONS

2022. <https://hal.science/tel-03976945v1/file/Thesis_DNA_data_storage_Belaid_HAMOUM.pdf> Dec. 31, 2022 (Dec. 31, 2022) the whole doc.

Qin, et al. "Robust Multi-read Reconstruction from Contaminated Custers Using Deep Neural Network for DNA Storage." arXiv preprint arXiv:2210.11106. Oct. 31, 2022 (Oct. 31, 2022) whole document (2022).

Zhang et al. Rbec: a Tool for Analysis of Amplicon Sequencing Data from Synthetic Microbial Communities. ISME communications, 1(1), 73. Jan. 17, 2021 (Jan. 17, 2021) whole document (2021).

* cited by examiner

600

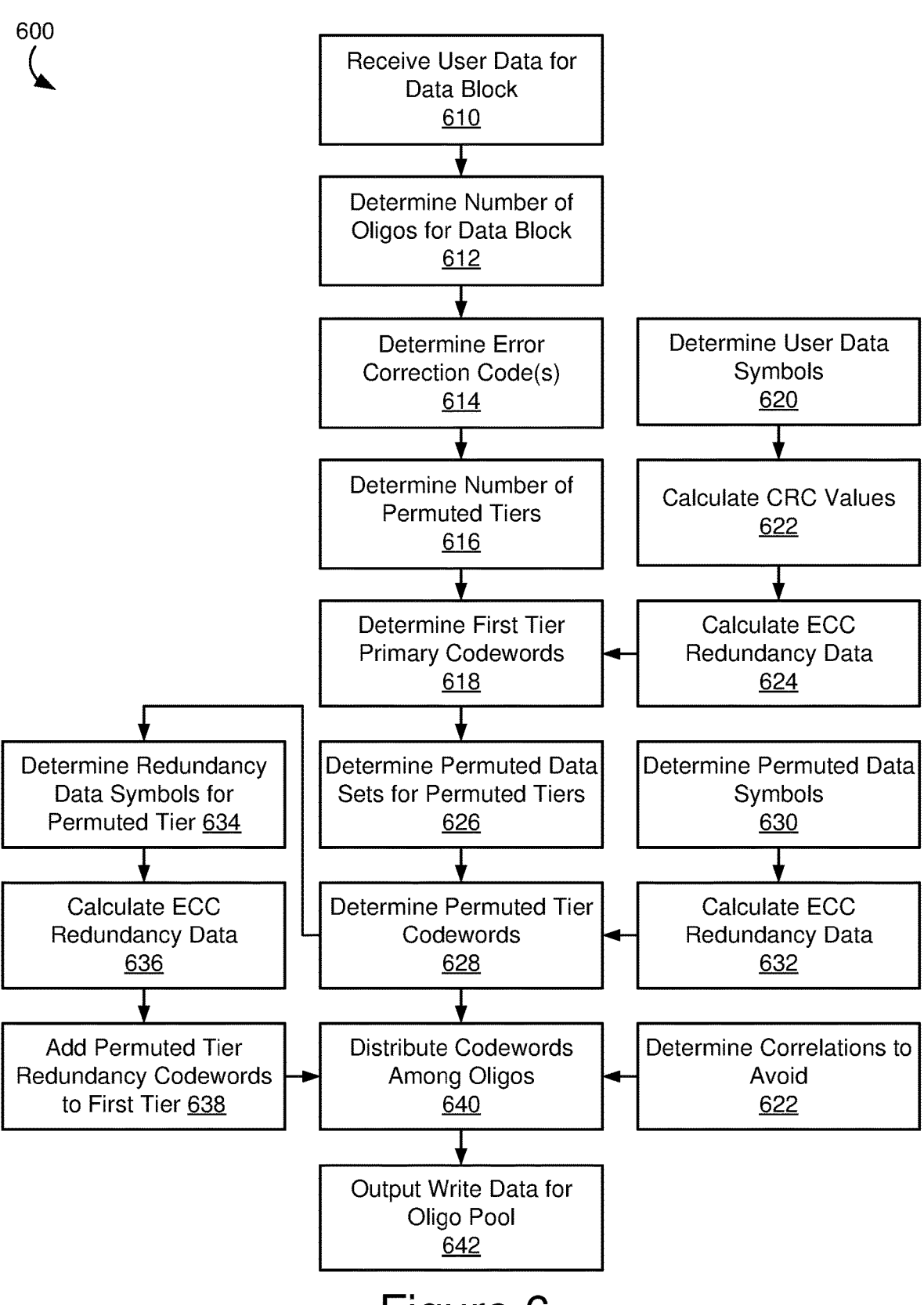

Receive User Data for
Data Block
610

Determine Number of
Oligos for Data Block
612

Determine Error
Correction Code(s)
614

Determine User Data
Symbols
620

Determine Number of
Permuted Tiers
616

Calculate CRC Values
622

Determine First Tier
Primary Codewords
618

Calculate ECC
Redundancy Data
624

Determine Redundancy
Data Symbols for
Permuted Tier 634

Determine Permuted Data
Sets for Permuted Tiers
626

Determine Permuted Data
Symbols
630

Calculate ECC
Redundancy Data
636

Determine Permuted Tier
Codewords
628

Calculate ECC
Redundancy Data
632

Add Permuted Tier
Redundancy Codewords
to First Tier 638

Distribute Codewords
Among Oligos
640

Determine Correlations to
Avoid
622

Output Write Data for
Oligo Pool
642

Receive Read Data from Sequencing Oligos
710

Determine First Tier Primary Codewords
712

Decode First Tier Primary Codewords Using ECC
714

Execute CRC Check
716

Determine Next Permuted Tier
718

Determine Permuted Tier Codewords
720

Determine CRC Mask
722

Apply CRC Mask to Permuted Tier Codewords 724

Selectively Decode Permuted Tier Codewords 726

Output Write Data for Oligo Pool
728

MULTI-TIER ERROR CORRECTION CODES FOR DNA DATA STORAGE

TECHNICAL FIELD

The present disclosure relates to deoxyribonucleic acid (DNA) data storage. In particular, the present disclosure relates to error correction for data stored as a set of synthetic DNA oligos.

BACKGROUND

DNA is a promising technology for information storage. It has potential for ultra-dense 3D storage with high storage capacity and longevity. Currently, technology of DNA synthesis provides tools for synthesis and manipulation of relatively short synthetic DNA chains (oligos). For example, some oligos may include 40 to 350 bases encoding twice that number of bits in configurations that use bit symbols mapped to the four DNA nucleotides or sequences thereof.

Similar to other data storage technologies, binary data may be encoded using various techniques prior to storage in the oligos and various decoding and error correction techniques may be applied after the data stored in the oligos is read back into binary data. Due to the relatively short payload capacity of oligos, Reed-Solomon error correction codes have been applied to individual oligos to enable error correction on a per-oligo basis. Other schemes have been proposed for applying larger and more sophisticated error correction codes to the data from groups of oligos, such as a group of oligos storing a particular data object.

DNA decoding may be divided into two stages. In the first stage, correlation analysis inside single oligos is used to eliminate deletion and insertion errors. In the second stage, error correction codes may be applied for conventional data decoding. For example, Reed-Solomon decoding may be applied to each oligo or a larger block size based on multiple oligos.

There is a need for technology that applies more robust and efficient error correction codes to DNA data storage and retrieval.

BRIEF DESCRIPTION OF THE DRAWINGS

The techniques introduced herein are illustrated by way of example, and not by way of limitation, in the figures of the accompanying drawings in which like reference numerals are used to refer to similar elements.

FIG. 6 is a block diagram of an example method of encoding a data unit in an oligo pool using multi-tier ECC.

SUMMARY

Figure 1A:
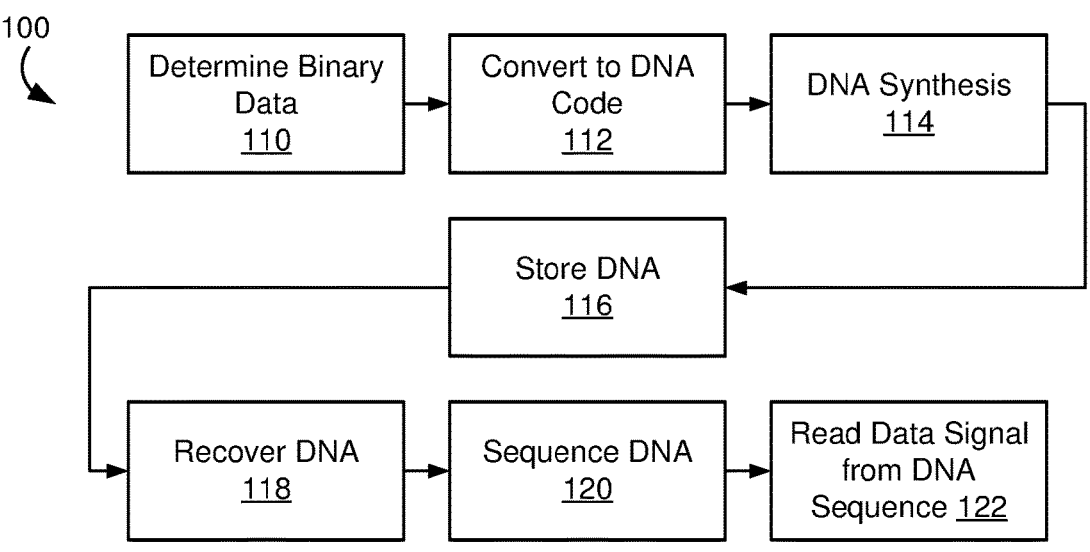
FIG. 1A is a block diagram of a prior art DNA data storage process.

Various aspects for using a multi-tier error correction code configuration that is distributed among the oligos in an oligo pool for DNA data storage are described.

One general aspect includes a system that includes an encoder configured to: determine a set of oligos for encoding a data unit, where each oligo of the set of oligos encodes a number of symbols; determine a first codeword for an error correction code, where the first codeword is may include of a first set of symbols for encoding the data unit; allocate symbols from the first set of symbols among a plurality of oligos from the set of oligos, where each oligo of the plurality of oligos receives one symbol from the first set of symbols; and output write data for the set of oligos to a synthesis interface for synthesizing the set of oligos.

Implementations may include one or more of the following features. The number of symbols may be encoded in sequential positions along a length of each oligo; and the first set of symbols may occupy the same sequential position in the plurality of oligos. The first codeword may include a plurality of symbols corresponding to user data in the data unit and at least one symbol corresponding to redundancy data for the error correction code. The first codeword may further include at least one symbol corresponding to a cyclic redundancy check value. The encoder may be further configured to: determine a first set of codewords that may include a plurality of codewords corresponding to the data unit and a first set of redundancy data for the data unit, where the first set of codewords includes the first codeword; determine at least one permuted data set based on the data unit and the first set of redundancy data; determine a second set of codewords that includes the at least one permuted data set and a second set of redundancy data for the at least one permuted data set; and allocate symbols for the first set of codewords and the second set of codewords to the set of oligos. The encoder may be further configured to add, responsive to determining the second set of redundancy data, codewords to the first set of codewords that include the second set of redundancy data and a third set of redundancy data for the second set of redundancy data. The set of oligos may store an aggregate number of symbols; the at least one permuted data set may include a plurality of permuted data sets based on the data unit and the first set of redundancy data; and the aggregate number of symbols may substantially equal a number of symbols in a combination of the first set of codewords and the second set of codewords. The system may include a decoder configured to: receive read data determined from sequencing the set of oligos; determine the first set of symbols for the first codeword from the read data; assemble the first codeword; decode, using the error correction code, the first codeword; and output, based on the decoded first codeword, the data unit. The decoder may be further configured to: determine, from the read data, a first set of codewords may include a plurality of codewords corresponding to the data unit and a first set of redundancy data for the data unit, where the first set of codewords includes the first codeword; determine, from the read data, a second set of codewords that include at least one permuted data set based on the data unit and the first set of redundancy data and a second set of redundancy data for the at least one permuted data set; decode the data unit using the first set of codewords; and selectively decode, responsive to a failure to decode at least one codeword in the first set of codewords, the second set of codewords. The decoder may be further configured to: determine a cyclic redundancy check value for each codeword in the first set of codewords; determine a validation mask by evaluating the cyclic redundancy check value for each codeword in the first set of codewords; and use the validation mask to determine target codewords for the selective decoding of the second set of codewords.

Another general aspect includes a method that includes: receiving read data determined from sequencing a set of oligos, where each oligo of the set of oligos encodes a number of symbols; determining a first set of symbols for a first codeword from the read data, where the first set of symbols encodes a portion of a data unit using an error correction code; assembling the first codeword from the first set of symbols, where the first set of symbols are distributed among a plurality of oligos from the set of oligos and each oligo of the plurality of oligos receives one symbol from the first set of symbols; decoding, using the error correction code, the first codeword; and outputting, based on the decoded first codeword, the data unit.

Implementations may include one or more of the following features. The number of symbols may be encoded in sequential positions along a length of each oligo; and the first set of symbols occupy the same sequential position in the plurality of oligos. The first codeword may include a plurality of symbols corresponding to user data in the data unit and at least one symbol corresponding to redundancy data for the error correction code. The first codeword may further include at least one symbol corresponding to a cyclic redundancy check value. The method may include: determining, from the read data, a first set of codewords that may include a plurality of codewords corresponding to the data unit and a first set of redundancy data for the data unit, where the first set of codewords includes the first codeword; determining, from the read data, a second set of codewords that include at least one permuted data set based on the data unit and the first set of redundancy data and a second set of redundancy data for the at least one permuted data set; decoding the data unit using the first set of codewords; and selectively decoding, responsive to a failure to decode at least one codeword in the first set of codewords, the second set of codewords. The method may include: determining a cyclic redundancy check value for each codeword in the first set of codewords; determining a validation mask by evaluating the cyclic redundancy check value for each codeword in the first set of code words; and using the validation mask to determine target codewords for the selective decoding of the second set of codewords. The method may include iteratively decoding the data unit by alternating between decoding using the first set of codewords and decoding using the second set of codewords, where: the first set of codewords correspond to a first tier of codewords encoding the data unit; the at least one permuted data set may include a plurality of permuted data sets based on the data unit and the first set of redundancy data; and the second set of codewords corresponds to a plurality of additional tiers of codewords encoding the plurality of permuted data sets. The method may include: receiving the data unit; determining a first set of codewords that includes a plurality of codewords corresponding to the data unit and a first set of redundancy data for the data unit, where the first set of codewords includes the first codeword; determining at least one permuted data set based on the data unit and the first set of redundancy data; determining a second set of codewords that include the at least one permuted data set and a second set of redundancy data for the at least one permuted data set; allocating symbols for the first set of codewords and the second set of codewords to the set of oligos; and outputting write data for the set of oligos to a synthesis interface for synthesizing the set of oligos. The method may include adding, responsive to determining the second set of redundancy data, codewords to the first set of codewords that include the second set of redundance data and a third set of redundancy data for the second set of redundancy data.

Still another general aspect includes a system that includes: means for receiving read data determined from sequencing a set of oligos, where each oligo of the set of oligos encodes a number of symbols; means for determining a first set of symbols for a first codeword from the read data, where the first set of symbols encodes a portion of a data unit using an error correction code; means for assembling the first codeword from the first set of symbols, where the first set of symbols are distributed among a plurality of oligos from the set of oligos and each oligo of the plurality of oligos receives one symbol from the first set of symbols; means for decoding, using the error correction code, the first codeword; and means for outputting, based on the decoded first codeword, the data unit.

The present disclosure describes various aspects of innovative technology capable of using multi-tiered error correction codes to encode and decode user data stored in a DNA oligo pool. The configurations of multi-tiered error correction codes provided by the technology may be applicable to a variety of computer systems used to store or retrieve data stored as a set of oligos in a DNA storage medium. The configurations may be applied to a variety of DNA synthesis and sequencing technologies to generate write data for storage as base pairs and process read data read from those base pairs. The novel technology described herein includes a number of innovative technical features and advantages over prior solutions, including, but not limited to: (1) improved storage efficiency for oligo pools, (2) reduced decoding complexity using relatively short codewords, and (3) improved decoding efficiency based on selective decoding and iteration in a multi-tiered error correction code configuration.

DETAILED DESCRIPTION

Novel data storage technology is being developed to use synthesized DNA encoded with binary data for long-term data storage. While current approaches may be limited by the time it takes to synthesize and sequence DNA, the speed of those systems is improving and the density and durability of DNA as a data storage medium is compelling. In an example configuration in FIG. 1A, a method 100 may be used to store and recover data from DNA.

At block 110, binary data for storage to the DNA medium may be determined. For example, any conventional computer data source may be targeted for storage in a DNA medium, such as data files, databases, data objects, data blocks from block storage devices, software code, etc. Due to the high storage density and durability of DNA media, the data targeted for storage may include very large data stores having archival value, such as collections of image, video, scientific data, software, and other archival data.

At block 112, the binary data may be converted to DNA code. For example, a convention computer data object or data file may be encoded according to a DNA symbol index, such as: A or T=1 and C or G=0; A=00, T=01, C-10, and G=11; or a more complex symbol index mapping sequences of DNA bases to predetermined binary data patterns. In some configurations, prior to conversion to DNA code, the source data may be encoded according to an oligo-length format that includes addressing and redundancy data for use in recovering and reconstructing the source data during the retrieval process.

At block 114, DNA may be synthesized to embody the DNA code determined at block 112. For example, the DNA code may be used as a template for generating a plurality of synthetic DNA oligos embodying that DNA code using various DNA synthesis techniques. In some configurations, a large data unit is broken into segments matching a payload capacity of the oligo length being used and each segment is synthesized in a corresponding DNA oligo. In some configurations, solid-phase DNA synthesis may be used to create the desired oligos. For example, each desired oligo may be built on a solid support matrix one base at a time to match the desired DNA sequence, such as using phosphoramidite synthesis chemistry in a four-step chain elongation cycle. In some configurations, column-based or microarray-based oligo synthesizers may be used.

At block 116, the DNA medium may be stored. For example, the resulting set of DNA oligos for the data unit may be placed in a fluid or solid carrier medium. The resulting DNA medium of the set of oligos and their carrier may then be stored for any length of time with a high-level of stability (e.g., DNA that is thousands of years old has been successfully sequenced). In some configurations, the DNA medium may include wells of related DNA oligos suspended in carrier fluid or a set of DNA oligos in a solid matrix that can themselves be stored or attached to another object. In some configurations, the set of oligos related to a particular data unit may be referred to as an oligo pool.

At block 118, the DNA oligos may be recovered from the stored medium. For example, the oligos may be separated from the carrier fluid or solid matrix for processing. The resulting set of DNA oligos may be transferred to a new solution for the sequencing process or may be stored in a solution capable of receiving the other polymerase chain reaction (PCR) reagents.

At block 120, the DNA oligos may be sequenced and read into a DNA data signal corresponding to the sequence of bases in the oligo. For example, the set of oligos may be processed through PCR to amplify the number of copies of the oligos from the stored set of oligos. In some configurations, PCR amplification may result in a variable number of copies of each oligo.

At block 122, a data signal may be read from the sequenced DNA oligos. For example, the sequenced oligos may be passed through a nanopore reader to generate an electrical signal corresponding to the sequence of bases. In some configurations, each oligo may be passed through a nanopore and a voltage across the nanopore may generate a differential signal with magnitudes corresponding to the different resistances of the bases. The analog DNA data signal may then be converted back to digital data based on one or more decoding steps, as further described with regard to method 130 in FIG. 1B.

Figure 1B:
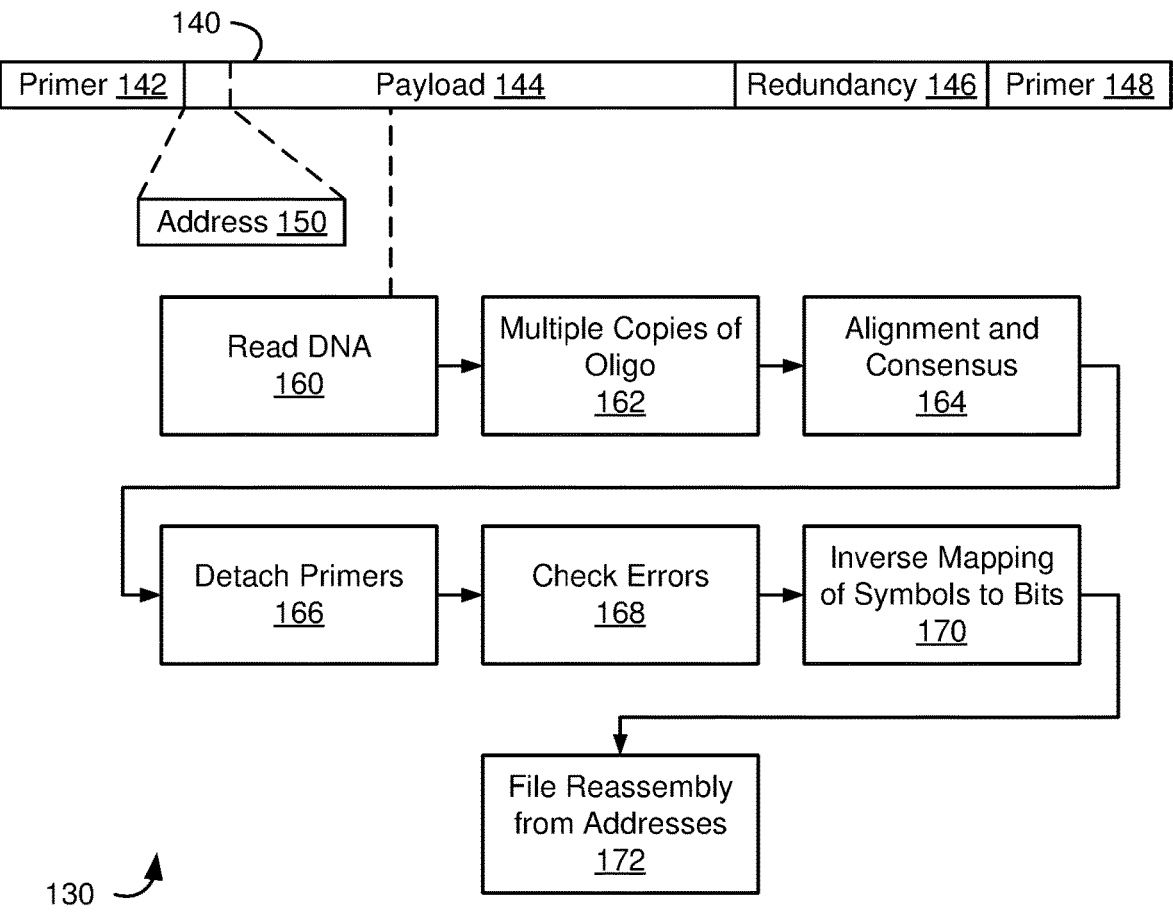
FIG. 1B is a block diagram of a prior art DNA data storage decoding process for oligos encoded with binary data.

In FIG. 1B, method 130 may be used to convert an analog read signal corresponding to a sequence of DNA bases back to the digital data unit that was the original target of the DNA storage process. In the example shown, the original digital data unit, such as a data file, was broken into data subunits corresponding to a payload size of the oligos and the set of oligos corresponding to the subunits of the data unit may be reassembled into the original data unit. An example oligo format 140, including primers 142 and 148 that may be added to support the PCR amplification and sequencing, may include a payload 144 comprising a subunit of the data unit, a redundancy portion 146 for error correction code (ECC) data for that subunit, and an address portion 150 for determining the sequence of the payloads for reassembling the data block. In some configurations, Reed-Solomon error correction codes may be used to determine the redundancy portion 146 for payload 144.

At block 160, DNA base data signals may be read from the sequenced DNA. For example, the analog signal from the nanopore reader may be conditioned (equalized, filtered, etc.) and converted to a digital data signal for each oligo.

At block 162, multiple copies of the oligos may be determined. Through the amplification process, multiple copies of each oligo may be produced, and the decoding system may determine groups of the same oligo to process together.

At block 164, each group of the same oligo may be aligned and consensus across the multiple copies may be determined. For example, a group of four copies may be aligned based on their primers and each base position along the set of base values may have a consensus algorithm applied to determine a most likely version of the oligo for further processing, such as, where 3 out of 4 agree, that value is used.

At block 166, the primers may be detached. For example, primers 142 and 148 may be removed from the set of data corresponding to payload data 144, redundancy data 146, and address 150.

At block 168, error checking may be performed on the resulting data set. For example, ECC processing of payload 144 based on redundancy data 146 may allow errors in the resulting consensus data set for the oligo to be corrected. The number of correctable errors may depend on the ECC code used. ECC codes may have difficulty correcting errors created by insertions or deletions (resulting in shifts of all following base values). The size of the oligo payload 144 and portion allocated to redundancy data 146 may determine and limit the correctable errors and efficiency of the data format.

At block 170, the bases or base symbols may be inversely mapped back to the original bit data. For example, the symbol encoding scheme used to generate the DNA code may be reversed to determine corresponding sequences of bit data.

At block 172, a file or similar data unit may be reassembled from the bit data corresponding to the set of oligos. For example, address 150 from each oligo payload may be used to order the decoded bit data and reassemble the original file.

Figure 2:
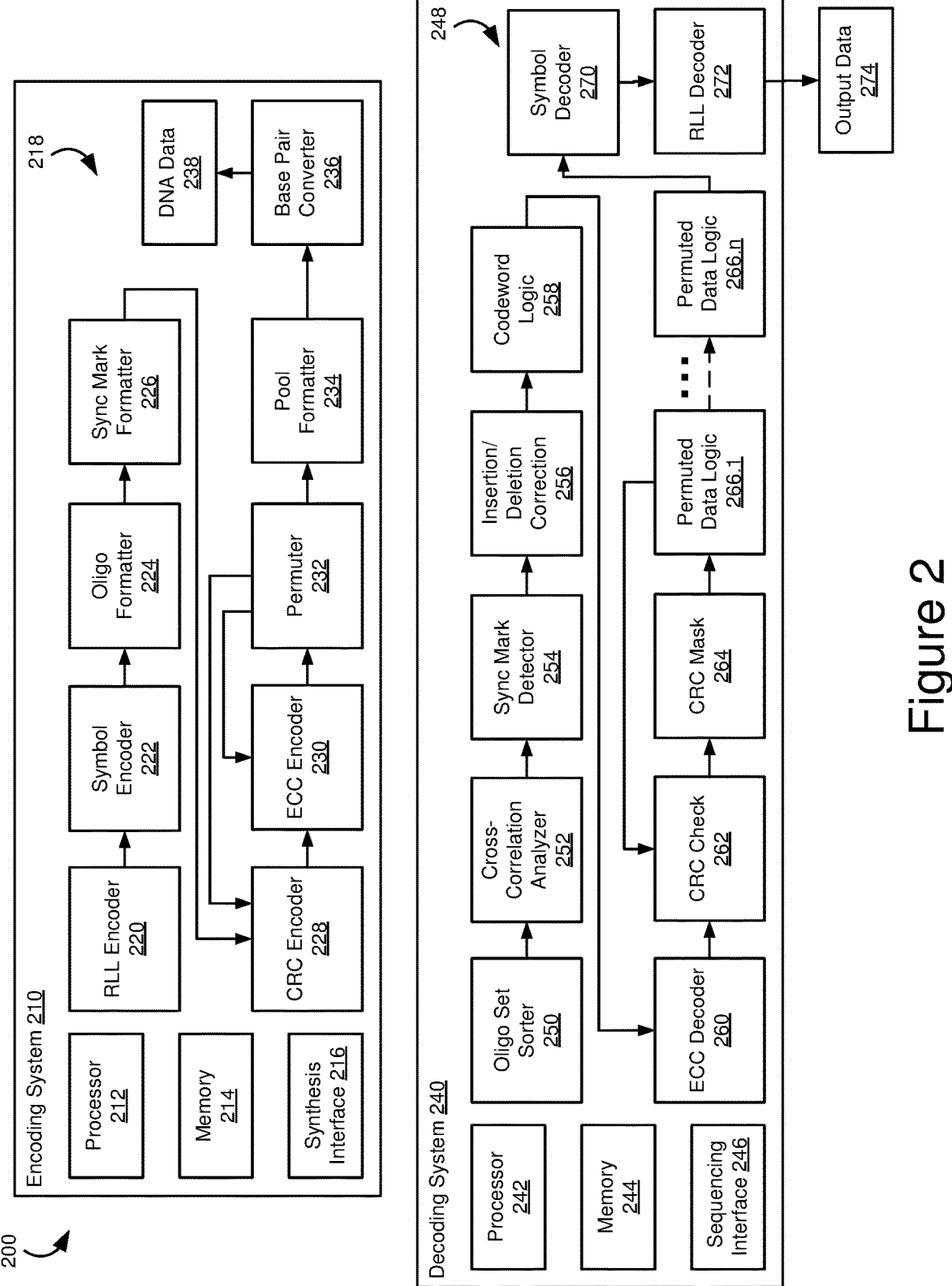
FIG. 2 is a block diagram of an example encoding system and example decoding system for DNA data storage using multi-tier error correction code (ECC).

FIG. 2 shows an improved DNA storage system 200 and, more specifically, an improved encoding system 210 and decoding system 240 for using multi-tier error correction codes distributed across oligos in an oligo pool to improve data retrieval and efficiency. In some configurations, encoding system 210 may be a first computer system used for determining target binary data, such as a conventional binary data unit, and converting it to a DNA base sequence for synthesis into DNA for storage and decoding system 240 may be a second computer system used for receiving the data signal corresponding to the base sequence read from the DNA.

In some configurations, DNA decoding may be divided into two stages. First is correlation analysis inside a single oligo to eliminate deletion and insertion errors. Second is final decoding, using a more conventional scheme like Reed-Solomon and block size bigger than single oligo. The use of multi-tier error correction codes may be implemented in the second part of the decoding procedure. The error correction processing may be configured to handle only traditional errors or erasures. The insertion and deletion errors may be assumed to be resolved in first stage of decoding. A relatively simple decoding scheme utilizing short codeword decoding may be selected, which is combined in a larger multi-tier scheme covering larger block sizes. The scheme may employ the fact that a DNA read operation is made on a larger pool of oligos simultaneously, unlike the typical stream read used in other storage devices (e.g., tapes, disk drives, etc.).

Encoding system 210 may include a processor 212, a memory 214, and a synthesis system interface 216. For example, encoding system 210 may be a computer system configured to receive or access conventional computer data, such as data stored as binary files, blocks, data objects, databases, etc., and map that data to a sequence of DNA bases for synthesis into DNA storage units, such as a set of DNA oligos. Processor 212 may include any type of conventional processor or microprocessor that interprets and executes instructions. Memory 214 may include a random-access memory (RAM) or another type of dynamic storage device that stores information and instructions for execution by processor 212 and/or a read only memory (ROM) or another type of static storage device that stores static information and instructions for use by processor 212. Encoding system 210 may also include any number of input/output devices and/or interfaces. Input devices may include one or more conventional mechanisms that permit an operator to input information to encoding system 210, such as a keyboard, a mouse, a pen, voice recognition and/or biometric mechanisms, etc. Output devices may include one or more conventional mechanisms that output information to the operator, such as a display, a printer, a speaker, etc. Interfaces may include any transceiver-like mechanism that enables encoding system 210 to communicate with other devices and/or systems. For example, synthesis system interface 216 may include a connection to an interface bus (e.g., peripheral component interface express (PCIe) bus, universal serial bus (USB), etc.) or network for communicating the DNA base sequences for storing the data to a DNA synthesis system. In some configurations, synthesis system interface 216 may include a network connection using internet or similar communication protocols to send a conventional data file listing the DNA base sequences for synthesis, such as the desired sequence of bases for each oligo to be synthesized, to the DNA synthesis system. In some configurations, the DNA base sequence listing may be stored to conventional removable media, such as a USB drive or flash memory card, and transferred from encoding system 210 to the DNA synthesis system using the removable media.

In some configurations, a series of processing components 218 may be used to process the target binary data, such as a target data file or other data unit, into the DNA base sequence listing for output to the synthesis system. For example, processing components 218 may be embodied in software and/or hardware circuits and collectively referred to as an encoder for encoding binary data base DNA base pair data. In some configurations, processing components 218 may be embodied in one or more software modules stored in memory 214 for execution by processor 212. Note that the series of processing components 218 are examples and different configurations and ordering of components may be possible without materially changing the operation of processing components 218. For example, in an alternate configuration, additional data processing, such as a data randomizer to whiten the input data sequence, may be used to preprocess the data before encoding. In another configuration, data may be divided according to codeword size for one or more ECC tiers and/or cyclic redundancy check (CRC), ECC, and tiers may be applied in different orders. Other variations are possible.

In some configurations, processing the target data may begin with a run length limited (RLL) encoder 220. RLL encoder 220 may modulate the length of stretches in the input data. RLL encoder 220 may employ a line coding technique that processes arbitrary data with bandwidth limits. Specifically, RLL encoder 220 may bound the length of stretches of repeated bits or specific repeating bit patterns so that the stretches are not too long or too short. By modulating the data, RLL encoder 220 can reduce problematic data sequences that could create additional errors in subsequent encoding and/or DNA synthesis or sequencing.

In some configurations, symbol encoder 222 may include logic for converting binary data into symbols based on the four DNA bases (adenine (A), cytosine (C), guanine (G), and thymine (T)). In some configurations, symbol encoder 222 may encode each bit as a single base pair, such as 1 mapping to A or T and 0 mapping to G or C. In some configurations, symbol encoder 222 may encode two-bit symbols into single bases, such as 11 mapping to A, 00 mapping to T, 01 mapping to G, and 10 mapping to C. More complex symbol mapping can be achieved based on multi-base symbols mapping to correspondingly longer sequences of bit data. For example, a two-base symbol may correspond to 16 states for mapping four-bit symbols or a four-base symbol may map the 256 states of byte symbols. Multi-base pair symbols could be preferable from an oligo synthesis point of view. For example, synthesis could be done not on base pairs but on lager blocks, like 'bytes' correlating to a symbol size, which are prepared and cleaned up earlier (e.g., pre-synthesized) in the synthesis process. This may reduce the amount of synthesis errors. From an encoder/decoder point of view, these physically larger blocks could be treated as symbols or a set of smaller symbols.

In some configurations, oligo formatter 224 may include logic for allocating portions of the target data unit to a set of oligos. For example, oligo formatter 224 may be configured for a predetermined payload size for each oligo and determine the number of symbols corresponding to the payload size for each oligo in the set. In some configurations, the payload size may be determined based on an oligo size used by the synthesis system and any portions of the total length of the oligo that are allocated to redundancy data, address data, sync mark data, or other data formatting constraints. For example, for a 150 base pair oligo using two-base symbols may include an eight-base addressing scheme and six four-base sync marks, resulting in 118 base pairs of the target data allocated to each oligo. In some configurations, oligo formatter 224 may insert a unique address for each oligo in the set, such as at the beginning or end of the data payload. In some configurations, the set of symbols that will be written to each oligo may be determined by pool formatter 324 based on the configuration and distribution of codewords across the oligos in the pool as a whole.

In some configurations, sync mark formatter 226 may include logic for inserting sync marks at predetermined intervals among the symbols. For example, sync marks may be inserted every 20 base pairs to divide the data in the oligo into a predetermined number of shorter segments. Sync marks could be any sequence of base pairs with good signal-to-noise ratio (SNR). To avoid false sync mark detection, this sequence could be excluded from user data by a specific modulation code. Use of sync marks to determine insertions and deletions is further described below with regard to decoding system 240.

In some configurations, encoding system 210 may use one or more tiers of CRC and/or ECC encoding based on treating the oligo pool as a storage pool and distributing codewords, CRC values, and redundancy data across oligos to minimize known error correlations that can impact the performance and/or reliability of ECC decoding. For example, encoding system 210 may use relatively small codewords that can be efficiently encoded and decoded using Reed-Solomon error correction codes, but distribute the symbols of the codeword across oligos such that any error correlation in an oligo is not transferred to the codeword. If each oligo includes only one symbol of each codeword it participates in, then oligo specific error conditions are not transferred to those codewords (i.e., they create at worst a single symbol error in each codeword). While the example configurations described herein focus on oligo-based error correlations, any known error correlation could be used to generate similar codeword construction rules if data demonstrates error correlation other than correlation inside oligos.

A multi-tier encoding and decoding scheme may be used that provides multiple protections of user data symbols while employing a standard codeword size and ECC encoding/decoding scheme. The effective size of the encoding block may equal the pool size, with multiple tiers of protection encoded within the set of oligos, providing a known format efficiency equal to the symbols in the input user data relative to the aggregate symbols encoded across all oligos in the pool. For example, the difference between the input user data and the aggregate symbols in the pool may be made up of CRC values, ECC redundancy data, and permutations thereof that provide the multiple tiers of ECC protection. So, while keeping the base codeword and symbol size small, a more robust total data protection configuration may be achieved. The tiered nature of the ECC protection also supports selective and iterative decoding with multiple passes of the same ECC decoding scheme (and, in some cases, decoding hardware or software), making decoding system 240 more efficient. In some configurations, each user symbol in the DNA oligo pool would be encoded in multiple ECC codewords and CRC to make the error floor for successful detection and decoding of user data very low. The error floor may be regulated by the ECC redundancy, number of tiers, and CRC size, relative to the user data size and the aggregate oligo pool size.

CRC encoder 228 may include logic for determining a CRC value for a particular set of user data symbols, such as the user data symbols of a particular codeword. For example, each first tier codeword may include a predetermined number of user data symbols, a CRC value (written as one or more symbols), and ECC redundancy symbols. In some configurations, CRC encoder 228 may be configured for the size of the aggregate user data symbols and a predetermined CRC divisor to generate the CRC value, one or more symbols corresponding to the remainder or checksum value. The CRC value may support a CRC check by decoding system 240 to detect errors in the user data symbols. Note that CRC is an error detection code, not an error correction code, as it may not, in and of itself, enable correction of the user data symbols in error. Decoding system 240 may use the CRC value and CRC checks to determine whether additional iterations of ECC decoding are needed for that set of user data symbols.

ECC encoder 230 may append one or more parity bits to the set of user data symbols to generate the codeword for later detection and correction of errors that occur during data reading process. For instance, added redundancy data may include one or more symbols of additional binary bits (parity bits) that may be associated with strings of binary bits (symbols) in the user data symbols (or other data unit being encoded) and enable a corresponding decoder to locate and correct errors in the user data symbol (up to a certain error correction capability defined by the ECC used). In some configurations, Reed-Solomon ECC or similar erasure codes (e.g., Bose-Chaudhuri-Hocquenghem (BCH) ECC) may be used to encode the sets of user data symbols by adding one or more check symbols as redundancy data. In some configurations, ECC encoder 230 may be used to encode the codewords of each tier of the ECC configuration in the pool. For example, ECC encoder 230 may operate on initial sets of user data symbols that encode the target data block and then encode permutations of the first tier data (user data, CRC values, and redundancy data) in codewords for the additional tiers. In some configurations, redundancy data from the additional tiers may also be encoded in codewords and added to the first tier.

Permuter 232 may include logic for generating permutations of codewords that regroup them for additional tiers of ECC encoding. For example, permuter 232 may operate on the codewords in the first tier, including the user data symbols, CRC values, and redundancy data, to regroup new codewords in additional layers to provide tiered data protection. In some configurations, permuter 232 may operate on the first tier data multiple times to generate multiple and different permutations of that data that may be distributed among the oligos to provide for each ECC tier. An example of possible permutation will be further described with regard to FIG. 3. In some configurations, permuted data based on the first tier codewords may be fed back to ECC encoder 230 or a similar ECC encoder to generate new codewords with an additional sets of redundancy data. In some configurations, the redundancy data from one or more permuted tiers may be encoded in additional code words by CRC encoder 228 and/or ECC encoder 230. For example, the new codewords, including redundancy data from permuted data, a corresponding CRC value, and corresponding ECC redundancy data, may be appended to the first tier for allocation across the oligos.

Pool formatter 234 may include logic for allocating symbols from the codewords calculated through CRC encoder 228, ECC encoder 230, and permuter 232 among the pool of oligos. For example, pool formatter 234 may include logic for assuring that two or more symbols from the same codeword do not get allocated to the same oligo. In some configurations, pool formatter 234 may define a symbol matrix for allocating the codeword symbols among the set of oligos in the pool. For example, the oligos may be arranged in a grid having a number of oligos per row equal to the number of symbols N in each codeword. The pool and grid may include N×K oligos, meaning that K codewords may be allocated in each layer of the oligo pool, where a layer is defined as the set of symbols having the same sequential position along the length of the oligos. The oligo pool and matrix may have M layers, where M is the number of symbols in the payload of each oligo. Pool formatter 234 may allocate all of the codewords from the combination of tiers in the oligo pool in any order and using a set of configuration rules determined to prevent or reduce correlations. For example, pool formatter 234 may only allocate one symbol from any given codeword to any given oligo. In some configurations, codewords may be allocated in tier order and fill sequential layers of the symbol matrix.

Base pair converter 236 may include logic for converting the binary symbol data and any associated address, sync mark, or similar formatting data into a base pair sequence for each oligo. For example, base pair converter 236 may receive a data array or similar data structure from pool formatter 234 where each oligo is represented by a string of binary data and base pair converter 236 may convert the binary data into a series of base pair indicators based in the DNA encoding scheme being used. The resulting DNA base sequence corresponding to the encoded target data unit may be output from processing components 218 as DNA data 238. For example, the base pair sequences for each oligo in the set of oligos corresponding to the target data unit may be stored as sequence listings for transfer to the synthesis system through synthesis system interface 216.

Decoding system 240 may include a processor 242, a memory 244, and a sequencing system interface 246. For example, decoding system 240 may be a computer system configured to receive or access analog and/or digital signal data from reading sequenced DNA, such as the data signals associated with a set of oligos that have been amplified, sequenced, and read from stored DNA media. Processor 242 may include any type of conventional processor or microprocessor that interprets and executes instructions. Memory 244 may include a random-access memory (RAM) or another type of dynamic storage device that stores information and instructions for execution by processor 242 and/or a read only memory (ROM) or another type of static storage device that stores static information and instructions for use by processor 242. Decoding system 240 may also include any number of input/output devices and/or interfaces. Input devices may include one or more conventional mechanisms that permit an operator to input information to decoding system 240, such as a keyboard, a mouse, a pen, voice recognition and/or biometric mechanisms, etc. Output devices may include one or more conventional mechanisms that output information to the operator, such as a display, a printer, a speaker, etc. Interfaces may include any transceiver-like mechanism that enables decoding system 240 to communicate with other devices and/or systems. For example, sequencing system interface 246 may include a connection to an interface bus (e.g., PCIe bus, USB, etc.) or network for receiving analog or digital representations of the DNA sequences from a DNA sequencing system. In some configurations, sequencing system interface 246 may include a network connection using internet or similar communication protocols to receive a conventional data file listing the DNA base sequences and/or corresponding digital sample values generated by analog-to-digital sampling from the sequencing read signal of the DNA sequencing system. In some configurations, the DNA base sequence listing may be stored to conventional removable media, such as a USB drive or flash memory card, and transferred to encoding system 240 from the DNA sequencing system using the removable media.

Decoding system 240 may include a set of processing components 248 for decoding a set of oligo read data into the user data unit that was originally encoded by encoding system 210. In some configurations, processing components 248 may be collectively embodied in a software or hardware decoder operating in decoding system 240 to receive read data and output user data. Decoding system 240 may use a first stage of error correction targeting the elimination of insertion and deletion errors (which create shifts in all following base pairs in a sequence), followed by ECC error correction to address mutation or erasure errors. DNA media and sequencing face three main types of errors: deletion, insertion, and mutation. Mutation errors are most similar to the traditional errors in data storage and may efficiently be handled using ECC correction. Insertion and deletion errors affect the position of all following bits or symbols and may not be effectively handled by ECC. Therefore, preprocessing the oligo sequences for sequence position shifts and, where possible, correcting those position shifts may contribute to more efficient and reliable data reading. The preprocessing stage may reduce the error rate in the oligo sequences significantly prior to applying ECC correction, enabling more efficient ECC codes and more reliable retrieval of data using a first level of ECC encoding in nested ECC configurations. In some configurations, the preprocessing stage may include oligo set sorter 250, cross-correlation analyzer 252, sync mark detector 254, and insertion/deletion correction 256.

In some configurations, oligo set sorter 250 may sort a received group of oligo data sequences into sets of copies. For example, the DNA amplification process may result in multiple copies of some or all oligos and oligo set sorter 250 may sort the oligo data sequences into like sequences. Sorting may be based on tagging during the sequencing process, address data, and/or statistical analysis of sequences (or samples thereof) to determine repeat copies of each oligo. Note that different copies may include different errors and, at this stage, exact matching of all bases in the sequence may not be the sorting criteria.

In some configurations, cross-correlation analyzer 252 may include logic for comparing two or more copies of an oligo to determine insertions and deletions. For example, following synthesis and identification of multiple copies of an oligo, insertion and deletion errors would have different locations for different copies and those insertions/deletions could be located by correlation analysis. Cross-correlation analysis may enable the elimination of insertion and deletion base errors. For example, where correlation analysis identifies an insertion, the specific insertion may be identified and removed to realign the following bases in the oligo. Where correlation analysis identifies a deletion, placeholder values may be added to realign the following bases in the oligo and the positions of the placeholders may be identified as an erasure for correction in the ECC stage. After analysis, uncertain areas where there is insufficient SNR and/or consensus across the copies, segments of bases may be identified and marked as erasures. For example, short shifted regions may have small correlation signals and could be treated as erasures, if SNR is not enough. In some configurations, averaging of correlated segments of bases across multiple copies may provide soft information for use in subsequent ECC processing. For example, the signals from multiple aligned copies may be averaged and statistically processed, providing soft information for each symbol.

In some configurations, sync mark detector 254 may include logic to identify periodic sync marks along the length of the oligo to assist in identifying insertion and deletion errors. For example, the sync marks inserted by sync mark formatter 226 may have a defined sync mark spacing corresponding to a number of base pairs that should appear between the sync marks. Sync mark detector 254 may detect the sync marks in the oligo and determine the number of base pairs between the sync marks. If the number of sync marks is greater than the sync mark spacing, then an insertion error has occurred. If the number of sync marks is less than the sync mark spacing, then a deletion error has occurred. Thus, whether an insertion or deletion error occurs in any segment of data between two sync marks may be determined, without impacting the data between other sync marks in the oligo. In some configurations, sync mark detection may be followed by cross-correlation analysis on the sync marks to determine insertions and deletions. Following sync mark analysis, no insertion or deletion errors should exist in regions where the sync marks align. Insertion or deletion within the data region between sync marks may lead to the entire region being identified as an erasure (since, based on sync marks alone, there may be no way to identify where the insertion or deletion occurred in the segment). Insertion or deletion within a sync mark itself may determine that the segments on both sides of that sync mark are treated as erasures. Sync mark detection and analysis may be performed on a single copy of an oligo in cases where multiple copies are not available. In some configurations, the operation of sync mark detector 254 may be combined with the operation of cross-correlation analyzer 252 where multiple copies are available. For example, sync mark detector 254 may be used to identify segments in which insertions and/or deletions exist, and cross-correlation analyzer 252 may target those regions for cross-correlation analysis to determine the specific locations of the insertions or deletions and related soft information. This may greatly reduce the amount of cross-correlation analysis to be performed.

In some configurations, insertion/deletion correction 256 includes logic for selectively correcting the insertion and deletion errors in an oligo, where possible. For example, insertion/deletion correction 256 may use the output from cross-correlation analyzer 252 and/or sync mark detector 254 to determine correctable insertion/deletion errors. For example, where an insertion or deletion error has occurred between sync marks, the position of subsequent segments may be corrected for the preceding shift in base pair positions. In some configurations, cross-correlation analysis may enable insertion/deletion correction 256 to specifically identify likely locations of insertion and/or deletion errors at more granular level, such as symbol, base pair, or other step size. For example, the correlation analysis across more than two copies of an oligo may allow statistical methods and soft information to be compared to a correction threshold for deleting inserted base pairs and/or inserting padding or placeholder base pairs (which may be identified as erasures) to at least partially correct insertions and/or deletions. In some configurations, insertion/deletion correction 256 may flag segments of base pairs in the oligo as erasures in need of ECC error correction. For example, sync mark detector 254 and related analysis may determine one or more segments between sync marks to be identified as erasures for error correction and/or cross-correlation analyzer 252 may determined deletion locations where unknown bases or symbols are missing identified as erasures. In some configurations, signal quality, statistical uncertainty, and/or specific thresholds for consensus may identify one or more segments as erasures because the processing by sync mark detector and/or cross-correlation analyzer is inconclusive. For example, insertion/deletion correction 256 may be configured to output an oligo that has had as many base pairs or symbols as possible positively identified as not containing insertion or deletion errors and identify (and localize) as erasures any segments that cannot be determined to be free of insertion or deletion errors prior to performing ECC error correction.

Use of multi-tiered ECC may provide improved and efficient error detection and correction for erasures using relatively short codewords and corresponding ECC codes. By using multiple tiers and distributing codeword symbols across oligos, a user data unit may be reliably decoded from the oligo pool and redundant tiers of permuted data may be selectively decoded to provide additional redundancy. For example, decoding system 240 may process first tier codewords using ECC decoder 260 and CRC check 262, identify any codewords that cannot be successfully decoded, and selectively proceed through decoding using one or more additional tiers. In some configurations, the first tier codewords may be reprocessed after each permuted data tier is decoded to determine whether the additional redundancy data enables successful decode of previously failed codewords.

Codeword logic 258 may include logic that maps the set of oligos back to the configuration of codewords written therein. For example, codeword logic 258 may include the inverse logic of pool formatter 234 for parsing the positions of each codeword (and tier of codewords) from the payloads of the set of oligos. In some configurations, codeword logic 258 may organize the payloads of the oligos and the sequences of symbols they contain into a matrix of symbols that can be separated according to their position in the matrix into distinct codewords and the tier in which the codeword was encoded. For example, codeword logic 258 may use the address value from each oligo to position its data in the same grid position that was used to encode it. Codeword logic 258 may output the set of codewords and/or portions thereof for processing through the following components in processing components 248.

ECC decoder 260 may include logic for receiving a codeword and decoding the input data (e.g., user data symbols) using the redundancy data in the codeword and the ECC encoding scheme. For example, ECC decoder 260 may operate in the codewords in the first tier that include user data, CRC values, and a first set of redundancy data calculated by ECC encoder 230. In some instances, ECC decoder 260 may successfully decode the codeword, determining the corresponding user data symbols. In some instances, ECC decoder 260 may fail to decode and determine that more errors are present than the correction capability of the ECC allows. In some instances, ECC decoder 260 may return a successful decode of the data unit, but the data unit may not be correct (as determined by CRC check 262). In some configurations, ECC decoder 260 may be invoked through multiple processing tiers. For example, in first tier processing, ECC decoder 260 may decode all codewords in the first tier, which may include a complete set of user data codewords, as well codewords containing redundancy data for any permuted tiers.

CRC check 262 may include logic for performing CRC checks on the codewords to validate those symbols and determine whether additional tiers of processing are needed. For example, CRC check 262 may evaluate the codeword based on the CRC value to determine whether the codeword is valid or an error has been detected. In some configurations, CRC check 262 may execute CRC checks for each codeword containing user data from the data block in the first tier of the codewords. For example, CRC check 262 may determine, for each codeword in the set of codewords for the data unit, the CRC validity and use the ECC outcome to determine the validity of each codeword for triggering additional decoding using one or more permuted tiers.

CRC mask 264 may include logic for controlling selective decoding through additional tiers of the oligo pool codewords. CRC mask 264 may generate a mask data structure that indicates whether specific symbols in the codewords were validated or not and how those symbols map to the codewords in the next tier of permuted data. CRC mask 264 may improve processing efficiency by determining what additional processing is done for decoding each codeword using the permuted data and corresponding redundancy data.

Permuted data logic 266.1-266.*n* may include logic for managing processing by ECC decoder 260 using CRC mask 264 for each iterative decoding process through each permuted data tier, as well as return of data to update the first tier decoding between permuted data tiers. For example, codewords may selectively pass through CRC mask 264 for ECC decoding based on the invalid symbols in each permuted tier codeword and determine the decoder processing for that permuted tier codeword. For example, a permuted tier codeword may include a number of non-validated symbols less than or equal to the error correction capability of that codeword. In this case, the codeword can be successfully decoded in the permuted tier and the correct values of those symbols returned. A permuted tier codeword may include no invalid symbols and it is already validated. In this case, no additional decoding needs to be done in the permuted tier. In some configurations, the permuted tier codeword may still be validated using CRC upon return to the first tier to provide a second level validation of CRC results. The number of non-validated symbols from non-recovered codewords in the first tier may be higher than the correction capability of the permuted tier codeword. In this case, decoding may still be carried out on the permuted tier codeword to see if one or more symbols may be recovered, even if complete recovery may not be possible. In some configurations, the corrected symbols from the permitted tier may be mapped back to their respective codewords in the first tier for additional decoding attempts between each permuted tier (and selective sequential operation of permuted data logic 266.1-266.*n* until all user data codewords in the first tier are recovered). For example, in a configuration with a permuted data second tier and a permuted data third tier, decoding operations may include: ECC decoding and CRC check of the first tier, selective ECC decoding of the second tier (based on CRC mask), return to first tier ECC decoding and CRC check, selective ECC decoding of the third tier (based on CRC mask), and return to first tier ECC decoding and CRC check. This pattern may be repeated for any number of permuted data tiers. In some configurations, CRC mask 264 and permuted data logic 266 may include logic (based on permuter 232) and/or a mapping data structure for determining the correlations among symbols in the user data tier (first tier) and each permuted data tier. For example, CRC mask 264 may map the symbols from the codewords in the first tier to the symbols in the codewords of the second tier and permuted data logic 266 may map the symbols from the codewords in the second tier back to the symbols in the first tier.

In some configurations, symbol decoder 270 may be configured to convert the symbols used to encode the bit data back to their bit data representations. For example, symbol decoder 270 may reverse the symbols generated by symbol encoder 222. In some configurations, symbol decoder 270 may receive the error corrected sequences from iterative decoding through ECC decoder 260, CRC check 262, CRC mask 264, and permuted data logic 266 and output a digital bit stream or bit data representation. For example, symbol decoder 270 may receive the array of symbols from the corrected codewords corresponding to the user data and convert them to bit representations for the data unit, subject to further post-processing decoding (to reverse an pre-processing encoding from encoding system 210).

In some configurations, RLL decoder 272 may decode the run length limited codes encoded by RLL encoder 220 during the data encoding process. In some configurations, the data may go through additional post-processing or formatting to place the digital data in a conventional binary data format. The output data 274 may then be output to a conventional binary data storage medium, network, or device, such as a host computer, network node, etc. for storage, display, and/or use as a convention binary data file or other data unit.

Figure 3:
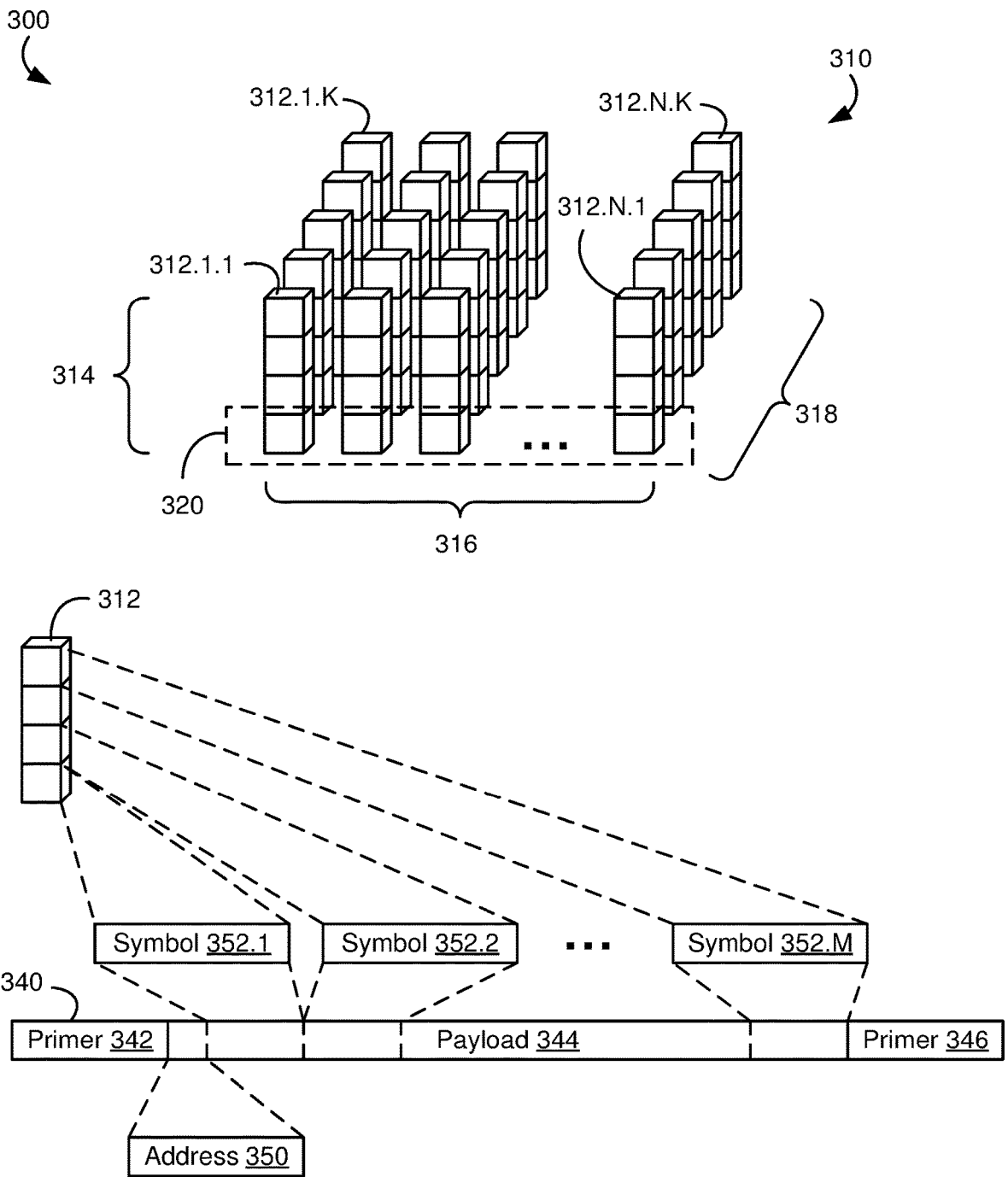
FIG. 3 is a diagram of an example matrix for constructing codewords in a pool of oligos for multi-tier error correction codes.

FIG. 3 shows an example matrix 300 for constructing codewords in a pool of oligos 310 for multi-tier error correction codes. Matrix 300 may be used to organize and assign the symbols 352 in a set if oligos in pool of oligos 310. In an example oligo format 340, a plurality of symbols 352 may be arranged in sequential order from symbol 352.1 to 352.M in the payload of each oligo 312. Each oligo 312 may have a symbol length 314 equal to the number of sequential symbols it accommodates. Each oligo 312 may be assigned to a two-dimensional matrix or grid with a width 316 and a depth 318, where the perpendicular orientation of the oligos defines symbol positions in three-dimensional matrix 300. That is the oligos may be viewed as vertical piles of symbols arranged in a grid. For example, symbol length 314 may be M symbols, grid width 316 may be N symbols, and grid depth 318 may be K symbols. The aggregate number of symbols that may be stored to oligo pool 310 may be equal to M×N×K. In some configurations, the encoding scheme may use multi-tier encoding where the aggregate number of symbols in oligo pool 310 is substantially equal the aggregate number of symbols used across the codewords in all tiers in the encoding scheme for the block size, such that the oligo lengths and/or payloads are fully utilized. In this context, substantially may refer to less than 1% of format efficiency loss from unused symbols. Similarly, the position of any symbol 352 may be referenced by a three number indication of (1 to M), (1 to N), (1 to K) and any oligo 312 may be references by a two number indication of (1 to N), (1 to K). While the (1 to M) value may denote a specific symbol in the context of a particular oligo, in the context of matrix 300, it may refer to a layer including all symbols having the same sequential position in the pool of oligos. Note that matrix 300 is a data construct used to map symbols 352 to oligo positions based on oligo address 350 and sequential symbol positions in those oligos. The actual oligos may not be physically arranged in a grid, merely the symbols written to and read from those oligos may be managed based on the matrix position assignments for encoding and decoding data in the oligos.

In the example shown, each oligo 312 includes four symbols arranged in an N×K matrix. The front left oligo 312.1.1, the back left oligo 312.1.K, the front right oligo 312.N.1, and the back right oligo 312.N.K provide examples of how the oligo positions may be designated. In the example shown, N is selected to equal the codeword size used for encoding the oligo pool. By standardizing to a codeword size and assigning codewords 320 across the grid, codewords may be guaranteed not to include multiple symbols on the same oligo and the efficiency of the oligo pool format may be easier to manage. This configuration prevents correlations between oligo and codeword because no codeword can contain two or more symbols from the same oligo, where errors are strongly correlated. Codewords 320 may be grouped only in the horizontal direction and a given ECC tier that combines all codewords from different planes (M×K of them). After a first tier, other tiers regroup the same symbols in different codewords, but the rule of "no two symbols in codeword from the same oligo" make it natural to make symbols a permutation within single horizontal plane of matrix 300. Tier 2 may be a set of the same symbols forming new codewords. Additional redundancy may be desired for these additional codewords. This will be further explained with regard to FIGS. 4 and 5. In some configurations, the permutation rules to form tier 2, 3, etc. may be the same, with a permutation of symbols to form new codewords done within a horizontal plane of matrix 300. Permutations in the vertical direction within one oligo may also be allowed, if codewords are still formed in the horizontal planes.

Note that this set of configuration rules are directed to reducing oligo correlations, but other correlations may be identified that would suggest additional or alternate rules for assigning symbols to codewords and codewords to positions in matrix 300.

Example oligo format 340 demonstrates how the data positions from matrix 300 may be mapped to oligo storage and vice versa. Each oligo 312, may include a payload 344 corresponding to an amount of data that can be encoded in the base pairs of the oligo. Payload 344 may be in addition to any primers 342, 346 or other elements that may be attached to the payload to assist with DNA synthesis or sequencing. Each oligo 312 may include an address 350 comprising a unique identifier for the oligo to assist with organizing oligo pool 310 to reconstruct the data stored therein. For example, address 350 may include the two-dimensional matrix position for that oligo along with a unique identifier associated with the data unit that is being stored. Payload 344 may then include a sequence of symbols 352.1-352.M that may be indexed by their position along the symbol sequence given a known symbol size. For example, symbols 352.1-352.M may be encoded in sequential positions along the length of oligo 312 and decoded based on those symbol positions corresponding to codewords written across multiple oligos. In some configurations, additional header information (e.g., symbol size, format standard, etc.) may be included in payload 344, as may sync marks or other formatting to assist with encoding and decoding the data therein.

Figure 4:
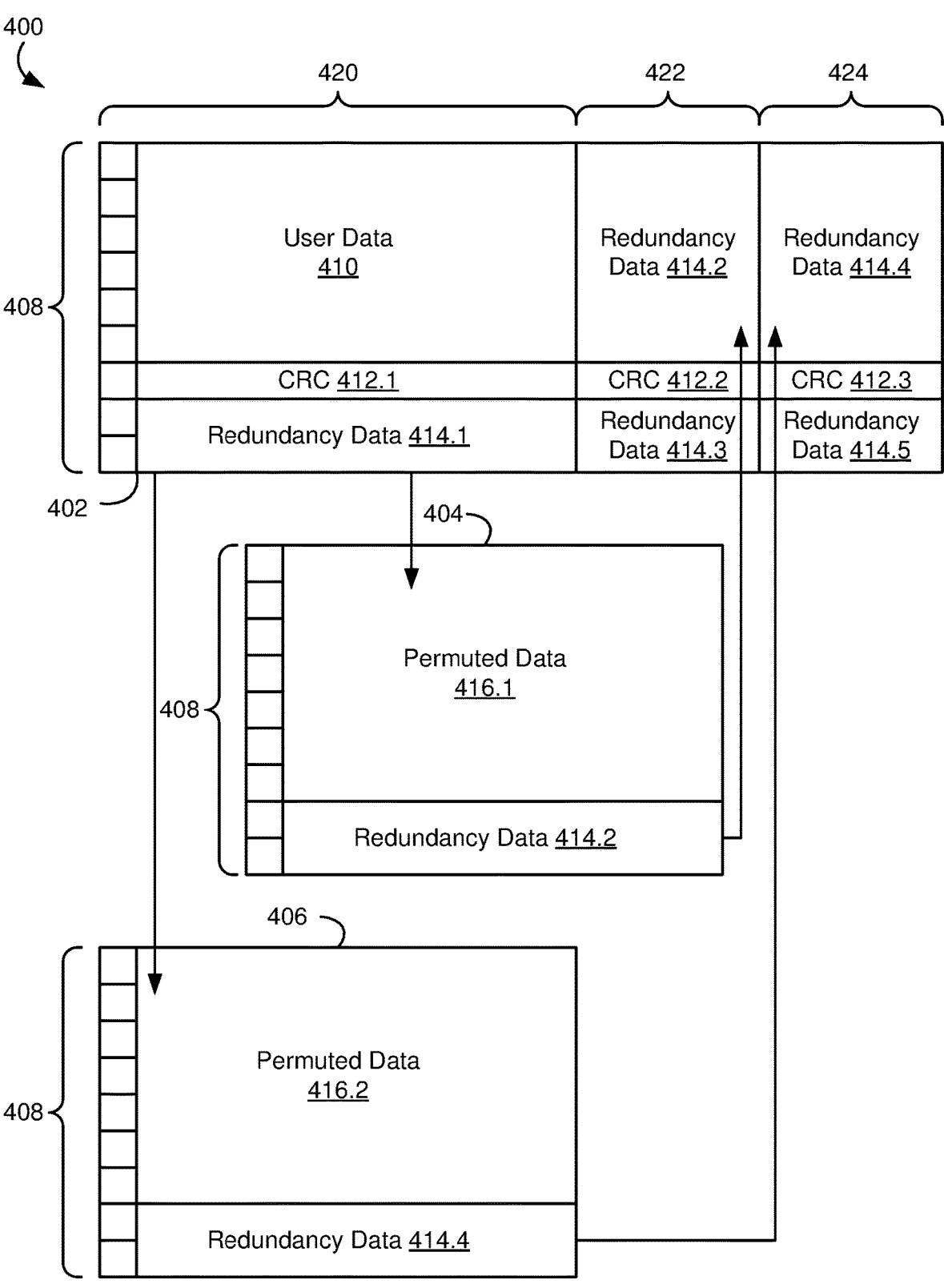
FIG. 4 is a diagram of an example configuration for oligo pool encoding.

FIG. 4 shows an example configuration 400 for oligo pool encoding. Configuration 400 includes a first tier 402, a second tier 404, and a third tier 406. First tier 402 may include a set of symbols containing a complete user data unit, shown as user data 410. Second tier 404 and third tier 406 may be permuted data tiers that encode permutations of the data in first tier 402 to provide additional redundancy for decoding the user data while using the same codeword size 408 and ECC encoder/decoder. Permuted codewords in second tier 404 and third tier 406 protect the same user data symbols additional times using different codewords.

In first tier 402, user data 410 includes a set of symbols corresponding to the user data unit being stored in the oligo pool. User data 410 may be used to generate a set of codewords using the construction rules described above with regard to system 200 and matrix 300. Each codeword in a first portion 420 of first tier 402 may include symbols from user data 410, a CRC value 412.1 (CRC bits) for the codeword, and a first set of redundancy data 414.1. In some configurations, first portion 420 may be a primary set of codewords for user data 410 and the additional permuted data tiers and their additional redundancy data may be selectively used to provide additional protection to recover codewords that are not recovered from first portion 420 through iterative decoding through first tier 402 and each of permuted second tier 404 and third tier 406.

In second tier 404, permuted data 416.1 may include permuted symbols of user data 410, CRC values 412.1, and redundancy data 414.1. Permutation may be based on a set of permutation rules to generate new codewords comprised of permuted data 416.1 and corresponding redundancy data 414.2 encoded to the same codeword size 408. In some configurations, redundancy data 414.2 may be less than redundancy data 414.1 and use ECC with the same codeword size but a lower number of correctable errors, such as 2 symbols of redundancy data. Further second tier 404 may not include CRC values. In some configurations, redundancy data 414.2 may be permuted and added to first tier 402 in a second portion 422. Second portion 422 may include redundancy data 414.2 protected by corresponding CRC value 412.2 and new redundance data 414.3 calculated for those codewords.

On third tier 406, permuted data 416.2 may include another set of permuted symbols of user data 410, CRC values 412.1, and redundancy data 414.1. Permutation may be based on the set of permutation rules to generate additional new codewords comprised of permuted data 416.1 and corresponding redundancy data 414.4 encoded to the same codeword size 408. In some configurations, redundancy data 414.4 may also be less than redundancy data 414.1 and use ECC with the same codeword size but a lower number of correctable errors, such as 2 symbols of redundancy data. Further third tier 406 may not include CRC values. In some configurations, redundancy data 414.4 may be permuted and added to first tier 402 in a third portion 424. Third portion 424 may include redundancy data 414.4 protected by corresponding CRC value 412.3 and new redundance data 414.5 calculated for those codewords. While two tiers of permuted data are shown for example configuration 400, any number of permuted data tiers may be included as appropriate to the size of the user data unit, oligo pool, and desired recoverability threshold. Multi-tier ECC based on permuted data provides multiple protection of user data. Codewords in different tiers are interconnected and effectively make the ECC block size equal to the aggregate symbol size of the entire oligo pool. Using a common codeword size 408 allows the encoding and decoding of any codeword in any tier using similar ECC encoder/decoders to simplify implementation.

Figure 5:
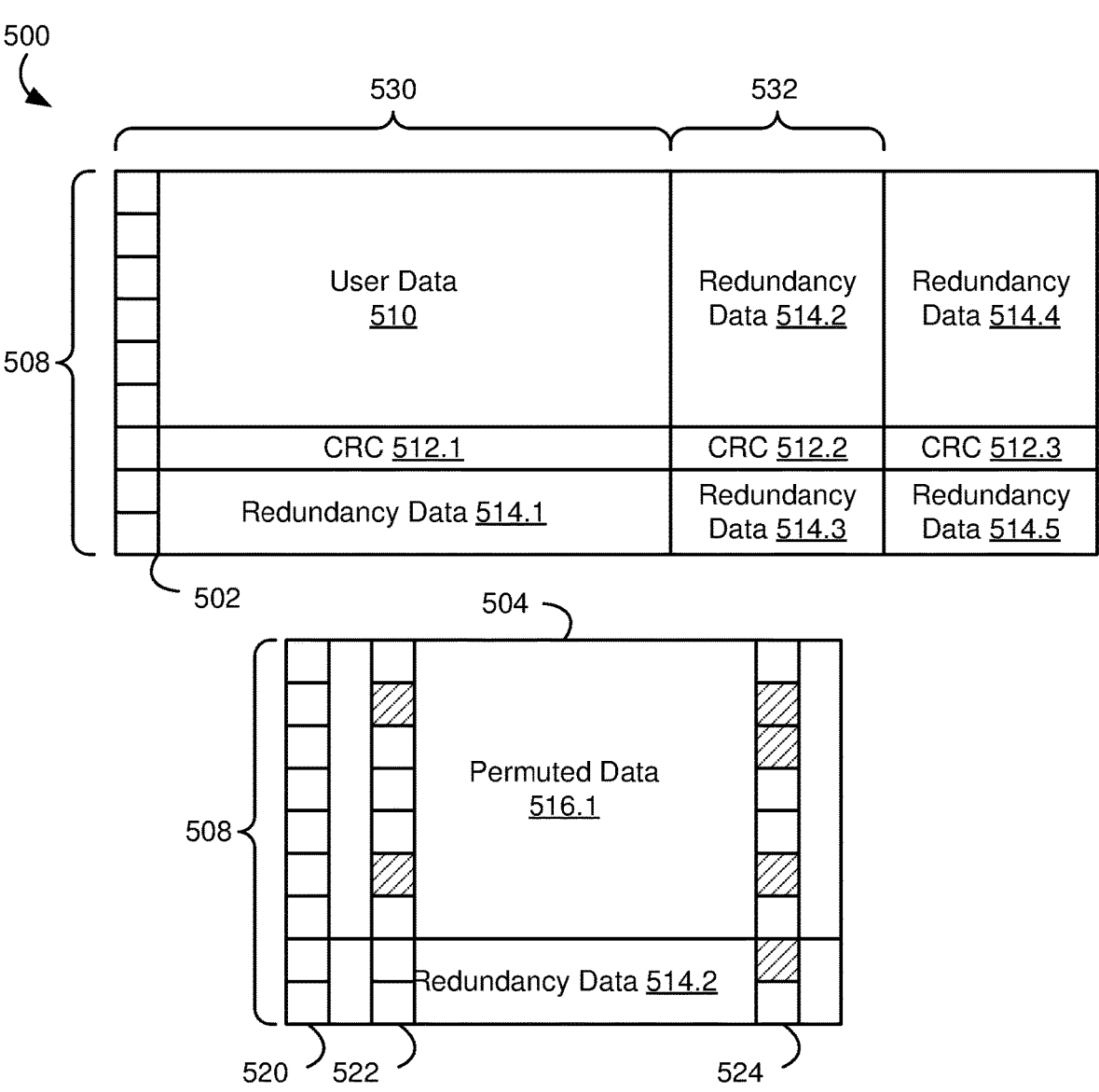
FIG. 5 is a diagram of an example configuration for oligo pool decoding.

FIG. 5 shows an example configuration 500 for oligo pool decoding. Configuration 500 includes a first tier 502 and a second tier CRC mask 504 or similar data validation mask. First tier 502 may include a set of symbols containing a complete user data unit, shown as user data 510. The second tier corresponding to second tier CRC mask 504 may be a permuted data tier that encodes a permutations of the data in first tier 502 to provide additional redundancy for decoding the user data while using the same codeword size 508 and ECC encoder/decoder. Note that first tier 502 is configured to support an additional permuted data tier (not shown), similar to configuration 400 in FIG. 4, but the decoding example shown may resolve user data 510 using only one tier of permuted data decoding. In this case, redundancy data 514.4, CRC values 512.3, and redundancy data 514.5 may not be used.

Decoding may begin with decoding the codewords in portion 530 using an ECC decoder for the ECC configuration. Each codeword may be successfully decoded to recover the corresponding symbols from user data 510 or may have a number of errors that exceed the decoding capability of the ECC and result in a decoding failure (in that iteration). CRC values 512.1 may then be used for a CRC check to validate the decoding by the ECC decoder. Second tier CRC mask 504 may be generated from the outputs of the ECC decoding and CRC checks of portion 530. Second tier CRC mask 504 may use a mapping of the invalid symbols from portion 530 to the permuted data 516.1 in the second tier. In some configurations, first tier 502 includes encoded redundancy data 514.2 for the second tier and that redundancy data may also be decoded using redundancy data 514.3 and CRC checked using CRC value 512.2 for use in the second tier processing. Second tier CRC mask 504 may be used to determine whether and what additional decoding should be processed using the second tier data. For example, codewords may selectively pass through CRC mask 504 for ECC decoding based on the invalid symbols in each permuted tier codeword and determine the decoder processing to selectively decode that permuted tier codeword.

As shown in codeword 520, a permuted tier codeword may include no invalid symbols and be validated from an ECC perspective. In this case, no additional decoding needs to be done in the second tier. In some configurations, codeword 520 may still be validated using CRC upon return to the first tier to provide a second level validation of CRC results. As shown for codeword 522, a permuted tier codeword may include a number of non-validated symbols less than or equal to the error correction capability of that codeword. In this case, the codeword can be successfully decoded in the permuted tier and the correct values of those symbols returned. As shown for codeword 524, the number of non-validated symbols from non-recovered codewords in the first tier may be higher than the correction capability of the permuted tier codeword. Not validated by CRC of tier 1 symbols in 524 may still not be corrupted and codeword 524 could be valid. In any case, decoding may still be carried out on the permuted tier codeword to see if one or more symbols may be recovered, even if complete recovery may not be possible.

In some configurations, the corrected symbols from the permitted tier may be mapped back to their respective codewords in the first tier for additional decoding attempts between each permuted tier. For example, in a configuration with a permuted data second tier and a permuted data third tier, decoding operations may include: ECC decoding and CRC check of the first tier, selective ECC decoding of the second tier (based on CRC mask), return to first tier ECC decoding and CRC check, selective ECC decoding of the third tier (based on CRC mask), and return to first tier ECC decoding and CRC check. After decoding of second tier codewords, validated symbols may be returned to the first tier to correct the corresponding symbols in the first tier. Decoding of the first tier codewords may be attempted again with the corrected symbols and allow additional codewords to successfully decode and validate with the CRC checks. The same process of CRC masking and decoding by the next permuted data tier may then be attempted. This pattern may be repeated for any number of permuted data tiers.

As shown in FIG. 6, the processing components 218 (or encoder) may be operated according to an example method of encoding a data unit in an oligo pool using multi-tier ECC, i.e., according to the method 600 illustrated by blocks 610-642.

At block 610, user data may be received for a data block to be stored in DNA. For example, the encoder may receive a data unit, such as a data file or data object, from a conventional binary data system.

At block 612, a number of oligos may be determined for the data block. For example, the encoder may be configured for an oligo pool size comprising a predetermined number of oligos.

At block 614, an error correction code may be determined. For example, the encoder may be configured with an ECC configuration for a codeword size and ECC algorithm, such as a Reed-Solomon ECC algorithm.

At block 616, a number of permuted tiers may be determined. For example, based on the aggregate symbols in the oligo pool, the size of the data unit, and desired redundancy, the encoder may be configured for one or more permuted ECC tiers for additional data protection.

At block 618, primary codewords for the first tier may be determined. For example, the encoder may generate a set of codewords for the data unit based on the ECC configuration, CRC, and data symbols from the user data unit.

At block 620, user data symbols may be determined for a codeword. For example, the encoder may divide the data unit into symbols and allocate them among the primary codewords.

At block 622, CRC values may be determined for the codeword. For example, the encoder may calculate CRC bits for the user data symbols and add them to the codeword.

At block 624, ECC redundancy data may be calculated for the codeword. For example, the encoder may calculate parity bits based on the ECC configuration and the user data symbols.

At block 626, permuted data sets may be determined for one or more permuted tiers. For example, the encoder may use permutation rules to rearrange the symbols of the user data, CRC values, and redundancy data from the primary codewords into permuted data for new codewords.

At block 628, permitted tier codewords may be determined. For example, the encoder may calculate new codewords using the ECC configuration and symbols from the permuted data.

At block 630, permuted data symbols may be determined. For example, the encoder may select sets of symbols from the permuted data for a new codeword.

At block 632, ECC redundancy data may be calculated for the new codeword. For example, the encoder may calculate redundancy data for the set of symbols from the permuted data to generate the new codeword.

At block 634, redundancy data symbols for a permuted tier may be determined. For example, for each permuted tier, the encoder may select the redundancy data symbols for that permuted tier and permute it into a set of redundancy data symbols for new codewords.

At block 636, ECC redundancy data may be calculated for the permuted tier redundancy data. For example, the encoder may divide the redundancy data symbols and calculate redundancy data for new codewords protecting the permuted tier redundancy data. In some configurations, the encoder may also calculate CRC values for the new codewords.

At block 638, permuted tier redundancy codewords may be added to the first tier. For example, the encoder may add the new codewords for the permuted tier redundancy data to the first tier codewords for each permuted tier.

At block 640, codewords may be distributed among the oligos in the oligo pool. For example, the encoder may use a set of rules and a matrix of symbol positions in the oligos to map the codewords to the oligos such that symbols in the same codeword are distributed across oligos with no more than one symbol per codeword on any give oligo.

At block 642, write data may be output for the oligo pool. For example, the encoder may output write data for the payload of each oligo in the set of oligos in the pool.

Figure 7:
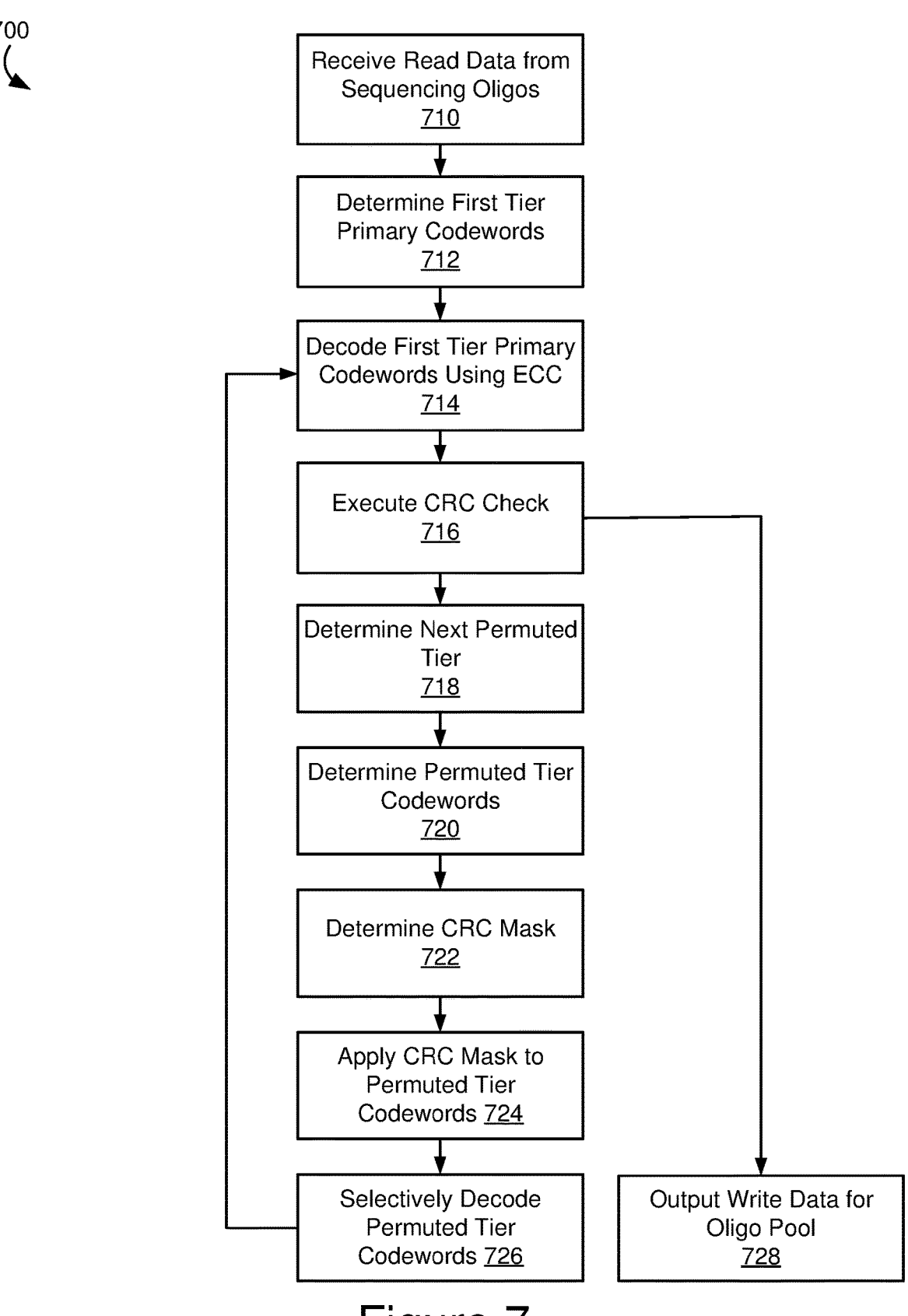
FIG. 7 is a block diagram of an example method of decoding a data unit from an oligo pool using multi-tier ECC.

As shown in FIG. 7, the processing components 248 (or decoder) may be operated according to an example method of decoding a data unit from an oligo pool using multi-tier ECC, i.e., according to the method 700 illustrated by blocks 710-728.

At block 710, read data may be received from sequencing a set of oligos. For example, the decoder may receive the read data from sequencing an oligo pool corresponding to a user data unit, such as an address and sequence of symbols for each oligo.

At block 712, first tier primary codewords may be determined. For example, the decoder may map the symbols from the oligos into a matrix of symbol positions and identify the set of symbols, such as the symbols from one or more layers, for a first tier of decoding and group them into codewords based on the matrix format.

At block 714, first tier primary codewords may be decoded using ECC. For example, the decoder may use an ECC decoder configuration to decode each codeword in the first tier, which may include primary codewords corresponding to user data symbols and permuted redundancy data codewords for one or more permuted tiers.

At block 716, a CRC check may be executed. For example, the decoder may calculate a CRC check for each codeword in the first tier based on CRC values in those codewords. If all primary codewords are successfully decoded and validated by the CRC check, method 700 may proceed to block 728. Otherwise, method 700 may proceed to block 718.

At block 718, a next permuted tier may be determined. For example, the encoder may determine whether and how many permuted tiers are stored in the oligo pool in addition to the first tier, based on the formatting and/or configuration data for the data unit and/or data pool.

At block 720, permuted tier codewords may be determined. For example, the decoder may select a next set of codewords for a permuted tier, such as from another layer in the matrix, corresponding to new codewords permuted from the first tier primary codewords.

At block 722, a CRC mask may be determined. For example, the decoder may map the symbols from the primary codewords to the permuted tier symbols and apply masking logic based on the primary codeword decoding outputs and CRC checks to identify symbols that have not yet been successfully decoded.

At block 724, the CRC mask may be applied to the permuted tier codewords. For example, the decoder may use the symbols that have not yet been decoded to determine permuted codewords to be decoded.

At block 726, permuted tier codewords may be selectively decoded. For example, the decoder may ECC decode the permuted tier codewords that include at least one symbol that has not yet been decoded. Method 700 may return to block 714 to iterate through additional decoding of the first tier and, if necessary, additional permuted tiers.

Figure 8:
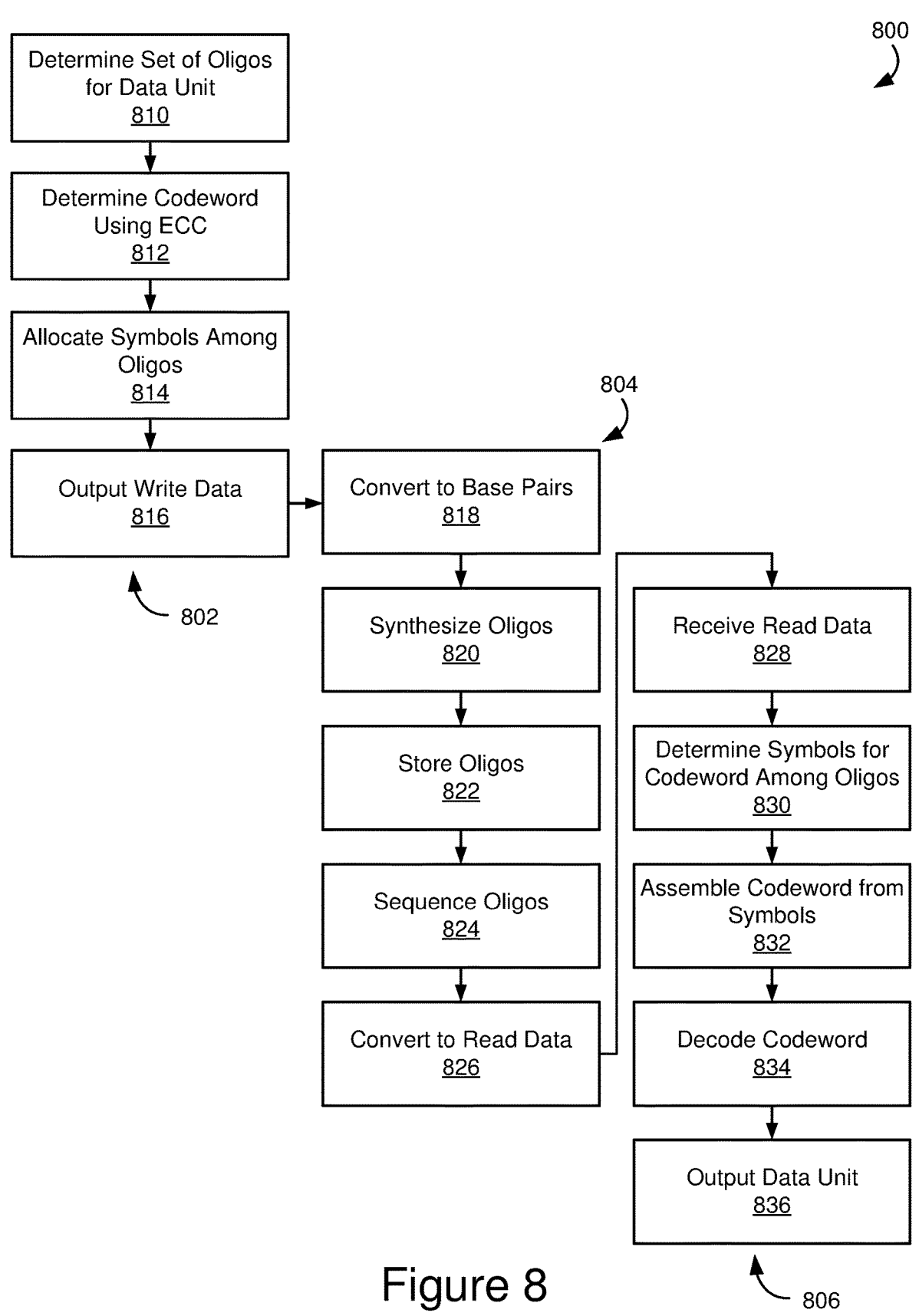
FIG. 8 is a block diagram of an example method of storing a data unit distributed among oligos in a DNA data storage oligo pool.

As shown in FIG. 8, the DNA storage system 200 may be operated according to an example method of storing a data unit distributed among oligos in a DNA data storage oligo pool, i.e., according to the method 800 illustrated by blocks 810-836. In some configurations, blocks 810-816 may be executed by an encoding system to encode 802 the data unit, blocks 818-826 may be executed using DNA synthesis, storage, and sequencing hardware to write and read 804 the data unit, and blocks 828-836 may be executed by a decoding system to decode 806 the data unit.

At block 810, a set of oligos may be determined for a data unit. For example, the storage system may generate or receive a conventional binary data unit for storage to DNA.

At block 812, codewords may be determined using ECC. For example, the storage system may divide symbols from the data unit among codewords and generate corresponding ECC redundancy data for those codewords based on the data unit symbols and an ECC configuration.

At block 814, symbols may be allocated among oligos in an oligo pool. For example, the storage system may distribute the symbols from each codeword among oligos in the oligo pool such that no oligo has more than one symbol from the same codeword.

At block 816, write data may be output. For example, the storage system may output write data corresponding to the symbols to be written in the payloads of the set of oligos.

At block 818, binary data may be converted to base pairs. For example, the storage system may convert a binary data sequence for each oligo into instructions for a corresponding sequence of base pairs corresponding to the binary data sequence.

At block 820, oligos may be synthesized. For example, the storage system may include a DNA synthesizer to synthesize a set of oligos encoding the base pair sequences.

At block 822, the oligos may be stored. For example, the storage system may place the synthesized set of oligos in a medium for storing the oligos for any period of time.

At block 824, the oligos may be sequenced. For example, the storage system (or another storage system) may process the set of oligos through a sequencer to generate sequence data corresponding to the stored base pairs.

At block 826, the sequence data may be converted to read data. For example, the storage system may sample a sequencer signal into digital signal data.

At block 828, the read data may be received by a decoding system. For example, the storage system may provide the digital read data from sequencing the oligos to a decoding system.

At block 830, symbols for codewords may be determined from among the oligos. For example, the storage system may organize the read data into a matrix based on oligo addresses and the sequential sets of symbols read from each oligo.

At block 832, codewords may be assembled from the symbols from the oligos. For example, the storage system may select a set of symbols from across a corresponding set of oligos that correspond to a codeword encoded during encoding 802.

At block 834, codewords may be decoded. For example, the storage system may decode the codeword using the ECC configuration with which it was encoded. In some configurations, multi-tier encoding and decoding may be used as described for FIGS. 6 and 7.

At block 836, the data unit may be output. For example, the storage system may reassemble the data unit from the decoded symbols in one or more codewords and output that data unit for use by conventional binary computing systems.

Technology for improved encoding and decoding of DNA data storage using multi-tier ECC distributed across an oligo pool is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including USB keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

The invention claimed is:
1. A system, comprising:
at least one hardware processor configured to, alone or in combination:

determine a configuration for a set of oligos for encoding a data unit comprised of user data, wherein each oligo of the set of oligos is configured to encode a number of symbols;

determine a first codeword for an error correction code, wherein the first codeword is comprised of a first set of symbols for encoding a portion of the data unit;

allocate symbols from the first set of symbols among a plurality of oligos from the set of oligos to populate at least a portion of the configuration with corresponding base pair sequences for the symbols from the first set of symbols, wherein each oligo of the plurality of oligos:

receives one symbol from the first set of symbols; and encodes a different set of symbols for the data unit from each other oligo in the plurality of oligos; and output, responsive to populating the configuration for the set of oligos with base pair sequences encoding the data unit, write data for the populated configuration for the set of oligos to a synthesis interface for synthesizing the set of oligos.

2. The system of claim 1, wherein:

the number of symbols is encoded in sequential positions along a length of each oligo of the set of oligos; and each symbol in the first set of symbols occupies the same sequential position in the corresponding oligo of the plurality of oligos.

3. The system of claim 1, wherein the first codeword comprises:

a plurality of symbols corresponding to user data in the data unit; and at least one symbol corresponding to redundancy data for the error correction code.

4. The system of claim 3, wherein the first codeword further comprises at least one symbol corresponding to a cyclic redundancy check value.

5. The system of claim 1, wherein the at least one hardware processor is further configured to, alone or in combination:

determine a first set of codewords comprising a plurality of codewords corresponding to the data unit and a first set of redundancy data for the data unit, wherein the first set of codewords includes the first codeword;

determine at least one permuted data set based on the data unit and the first set of redundancy data;

determine a second set of codewords comprising:

the at least one permuted data set; and a second set of redundancy data for the at least one permuted data set; and allocate symbols for the first set of codewords and the second set of codewords to the set of oligos.

6. The system of claim 5, wherein the at least one hardware processor is further configured to, alone or in combination:

add, responsive to determining the second set of redundancy data, codewords to the first set of codewords comprising:

the second set of redundancy data; and a third set of redundancy data for the second set of redundancy data.

7. The system of claim 6, wherein:

the set of oligos stores an aggregate number of symbols;

the at least one permuted data set comprises a plurality of permuted data sets based on the data unit and the first set of redundancy data; and the aggregate number of symbols equals at least a number of symbols in a combination of the first set of codewords and the second set of codewords.

8. The system of claim 1, wherein the at least one hardware processor is further configured to, alone or in combination:

receive read data determined from sequencing the set of oligos;

determine the first set of symbols for the first codeword from the read data;

assemble the first codeword;

decode, using the error correction code, the first codeword; and output, based on the decoded first codeword, the portion of the data unit.

9. The system of claim 8, wherein the at least one hardware processor is further configured to, alone or in combination:

determine, from the read data, a first set of codewords comprising a plurality of codewords corresponding to the data unit and a first set of redundancy data for the data unit, wherein the first set of codewords includes the first codeword;

determine, from the read data, a second set of codewords comprising:

at least one permuted data set based on the data unit and the first set of redundancy data; and a second set of redundancy data for the at least one permuted data set;

decode the data unit using the first set of codewords; and selectively decode, responsive to a failure to decode at least one codeword in the first set of codewords, the second set of codewords.

10. The system of claim 9, wherein the at least one hardware processor is further configured to, alone or in combination:

determine a cyclic redundancy check value for each codeword in the first set of codewords;

determine a validation mask by evaluating the cyclic redundancy check value for each codeword in the first set of codewords; and use the validation mask to determine target codewords for the selective decoding of the second set of codewords.

11. A method comprising:

receiving read data determined from sequencing a set of oligos, wherein each oligo of the set of oligos encodes a number of symbols in corresponding base pair sequences;

determining a first set of symbols for a first codeword from the read data, wherein the first set of symbols encodes, using an error correction code, a portion of a data unit comprising user data;

assembling the first codeword from the first set of symbols, wherein:

the first set of symbols are distributed among a plurality of oligos from the set of oligos;

each oligo of the plurality of oligos received one symbol from the first set of symbols; and each oligo of the plurality of oligos encodes a different set of symbols for the data unit from each other oligo in the plurality of oligos;

decoding, using the error correction code, the first codeword; and outputting, based on the decoded first codeword, the portion of the data unit.

12. The method of claim 11, wherein:

the number of symbols is encoded in sequential positions along a length of each oligo of the set of oligos; and each symbol of the first set of symbols occupies the same sequential position in the corresponding oligo of the plurality of oligos.

13. The method of claim 11, wherein the first codeword comprises:

a plurality of symbols corresponding to the user data in the data unit; and at least one symbol corresponding to redundancy data for the error correction code.

14. The method of claim 13, wherein the first codeword further comprises at least one symbol corresponding to a cyclic redundancy check value.

15. The method of claim 11, further comprising:

determining, from the read data, a first set of codewords comprising a plurality of codewords corresponding to the data unit and a first set of redundancy data for the data unit, wherein the first set of codewords includes the first codeword;

determining, from the read data, a second set of codewords comprising:

at least one permuted data set based on the data unit and the first set of redundancy data; and a second set of redundancy data for the at least one permuted data set;

decoding the data unit using the first set of codewords; and selectively decoding, responsive to a failure to decode at least one codeword in the first set of codewords, the second set of codewords.

16. The method of claim 15, further comprising:

determining a cyclic redundancy check value for each codeword in the first set of codewords;

determining a validation mask by evaluating the cyclic redundancy check value for each codeword in the first set of codewords; and using the validation mask to determine target codewords for the selective decoding of the second set of codewords.

17. The method of claim 15, further comprising:

iteratively decoding the data unit by alternating between decoding using the first set of codewords and decoding using the second set of codewords, wherein:

the first set of codewords correspond to a first tier of codewords encoding the data unit;

the at least one permuted data set comprises a plurality of permuted data sets based on the data unit and the first set of redundancy data; and the second set of codewords corresponds to a plurality of additional tiers of codewords encoding the plurality of permuted data sets.

18. The method of claim 11, further comprising:

receiving the data unit;

determining a first set of codewords comprising a plurality of codewords corresponding to the data unit and a first set of redundancy data for the data unit, wherein the first set of codewords includes the first codeword;

determining at least one permuted data set based on the data unit and the first set of redundancy data;

determining a second set of codewords comprising:

the at least one permuted data set; and a second set of redundancy data for the at least one permuted data set;

allocating symbols for the first set of codewords and the second set of codewords to a configuration for the set of oligos; and outputting, responsive to populating the configuration for the set of oligos with base pair sequences encoding the data unit, write data for the populated configuration of the set of oligos to a synthesis interface for synthesizing the set of oligos.

19. The method of claim 18, further comprising:

adding, responsive to determining the second set of redundancy data, codewords to the first set of codewords comprising:

the second set of redundancy data; and a third set of redundancy data for the second set of redundancy data.

20. A system comprising:

means for receiving read data determined from sequencing a set of oligos, wherein each oligo of the set of oligos encodes a number of symbols in corresponding base pair sequences;

means for determining a first set of symbols for a first codeword from the read data, wherein the first set of symbols encodes, using an error correction code, a portion of a data unit comprising user data;

means for assembling the first codeword from the first set of symbols, wherein:

the first set of symbols are distributed among a plurality of oligos from the set of oligos;

each oligo of the plurality of oligos received one symbol from the first set of symbols; and each oligo of the plurality of oligos encodes a different set of symbols for the data unit from each other oligo in the plurality of oligos;

means for decoding, using the error correction code, the first codeword; and means for outputting, based on the decoded first codeword, the portion of the data unit.

* * * * *